(12) United States Patent
Cha et al.

(10) Patent No.: US 10,037,765 B2
(45) Date of Patent: Jul. 31, 2018

(54) APPARATUS AND METHOD OF REDUCING NOISE AND AUDIO PLAYING APPARATUS WITH NON-MAGNET SPEAKER

(71) Applicant: SAMSUNG ELECTRONICS CO., LTD., Suwon-si (KR)

(72) Inventors: A-ran Cha, Goyang-si (KR); Gun-woo Lee, Suwon-si (KR); Sang-chul Ko, Seoul (KR); Young-sang Lee, Siheung-si (KR); Yoon-jae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 295 days.

(21) Appl. No.: 14/509,447

(22) Filed: Oct. 8, 2014

(65) Prior Publication Data
US 2015/0100310 A1    Apr. 9, 2015

Related U.S. Application Data

(60) Provisional application No. 61/888,137, filed on Oct. 8, 2013.

(30) Foreign Application Priority Data

Jul. 8, 2014  (KR) .......................... 10-2014-0085353

(51) Int. Cl.
*G10L 21/02* (2013.01)
*G10L 21/0208* (2013.01)
(Continued)

(52) U.S. Cl.
CPC ........ *G10L 21/0208* (2013.01); *G01R 33/283* (2013.01); *G10L 19/005* (2013.01);
(Continued)

(58) Field of Classification Search
CPC .... G11C 2207/16; G11C 7/16; H05K 999/99; G10L 19/02; G10L 19/12; G10L 21/04;
(Continued)

(56) References Cited

U.S. PATENT DOCUMENTS

| | | |
|---|---|---|
| 6,463,316 B1 | 10/2002 | Brungart |
| 6,717,991 B1 | 4/2004 | Gustafsson et al. |

(Continued)

FOREIGN PATENT DOCUMENTS

| | | |
|---|---|---|
| CN | 1419794 A | 5/2003 |
| CN | 101411074 A | 4/2009 |

(Continued)

OTHER PUBLICATIONS

Communication dated Mar. 4, 2015, issued by the European Patent Office in counterpart European Application No. 14188214.2.
(Continued)

*Primary Examiner* — Vu B Hang
(74) *Attorney, Agent, or Firm* — Sughrue Mion, PLLC

(57) ABSTRACT

An audio apparatus is provided. The audio apparatus includes an input configured to receive an audio signal containing noise; a period estimation unit configured to estimate a period of a noise pattern in the audio signal; a noise reducer configured to subtract and remove the noise pattern from the audio signal in a frequency domain by using the estimated period of the noise pattern; a noise updater configured to update the noise pattern according to a change in amplitude of the noise; and an output configured to output the audio signal obtained by removing the noise pattern.

8 Claims, 21 Drawing Sheets

(51) Int. Cl.
*H04R 1/28* (2006.01)
*H04R 15/00* (2006.01)
*H04R 9/06* (2006.01)
*G01R 33/28* (2006.01)
*G10L 19/005* (2013.01)
*G10L 21/0232* (2013.01)
*G10K 11/178* (2006.01)

(52) U.S. Cl.
CPC .............. *H04R 1/288* (2013.01); *H04R 9/06* (2013.01); *H04R 15/00* (2013.01); *G10K 11/178* (2013.01); *G10K 2210/1081* (2013.01); *G10L 21/0232* (2013.01); *G10L 2021/02085* (2013.01)

(58) Field of Classification Search
CPC ... G10L 19/173; G10L 21/0208; G10L 25/78; G10L 15/20; G10L 19/005; H04B 1/667; A61B 5/055; G01R 33/56
USPC ........ 600/410; 704/201, 203, 205, 211, 221, 704/226, 227, 228, 233
See application file for complete search history.

(56) References Cited

U.S. PATENT DOCUMENTS

| | | |
|---|---|---|
| 8,050,646 B2 | 11/2011 | Gozen |
| 8,085,942 B2 | 12/2011 | Rasmussen |
| 8,214,012 B2 | 7/2012 | Zuccolotto et al. |
| 9,159,335 B2 | 10/2015 | Kim et al. |
| 2002/0018578 A1* | 2/2002 | Burton .................... H04R 3/14 381/431 |
| 2005/0283068 A1* | 12/2005 | Zuccolotto ........... A61B 5/0555 600/410 |
| 2009/0274251 A1* | 11/2009 | Gozen .................... H03G 3/345 375/346 |
| 2011/0231185 A1 | 9/2011 | Kleffner et al. |

FOREIGN PATENT DOCUMENTS

| | | |
|---|---|---|
| CN | 101727909 A | 6/2010 |
| CN | 103024631 A | 4/2013 |
| DE | 102010041146 A1 | 3/2012 |
| EP | 2500742 A1 | 9/2012 |
| JP | 2007327980 A | 12/2007 |
| JP | 2009188858 A | 8/2009 |

OTHER PUBLICATIONS

Cusack R et al., "Automated POST-HOC Noise Cancellation Tool for Audio Recordings Acquired in an MRI Scanner", Human Brain Mapping, vol. 24, No. 4, Apr. 1, 2005, pp. 299-304, XP 007911113, Chapter "Materials and Methods".

Communication dated Jun. 23, 2015 by the European Patent Office in related Application No. 14188214.2.

Communication dated Apr. 27, 2017, issued by the State Intellectual Property Office of the People's Republic of China in counterpart Chinese Patent Application No. 201410525793.9.

Communication dated Nov. 10, 2017 issued by the State Intellectual Property Office of P.R. China in counterpart Chinese Application No. 201410525793.9.

* cited by examiner

APPARATUS AND METHOD OF REDUCING NOISE AND AUDIO PLAYING APPARATUS WITH NON-MAGNET SPEAKER

RELATED APPLICATIONS

This application claims the benefit of U.S. Provisional Application No. 61/888,137, filed on Oct. 8, 2013, in the US Patent Office and claims priority from Korean Patent Application No. 10-2014-0085353, filed on Jul. 8, 2014, in the Korean Intellectual Property Office, the disclosures of which are incorporated herein in their entireties by reference.

BACKGROUND

1. Field

Exemplary embodiments relate to an audio communication method and apparatus that enable smooth communication without being adversely affected by noise having a pattern repeated at a predetermined period. In particular, an audio communication method facilitates communication between medical personnel and a patient without being adversely affected by noise that is produced by a magnetic resonance imaging (MRI) procedure in order to provide entertainment, communication, and patient diagnosis services by using a display, a headset, or a speaker during the MRI procedure, and an audio playing apparatus for playing back multimedia content for a patient during the MRI procedure.

2. Description of the Related Art

One method of reducing noise for audio communication is to use a beamforming technique. The method involves receiving an input containing a mixture of noise and audio signals via a plurality of microphones and recovering the audio signals by using Maximum-Kurtosis Distortionless Response (MKDR) and Minimum Variance Distortionless Response (MVDR) algorithms.

In an MRI environment where a strong magnetic field is present, a material including general magnetic component should not be used. Thus, in an MRI environment applying a strong magnetic field, a general dynamic speaker does not operate normally. A pneumatic speaker or piezo-electro speaker has been used in order to transmit an audio signal to a patient that is placed in a strong magnetic field. Since these speakers do not use magnetic materials, they may operate in a strong-field MRI environment without compromising MRI image quality. However, the speakers exhibit overall poor characteristics due to their limitations in terms of low-frequency reproduction capability and output level.

SUMMARY

One or more exemplary embodiments include a system and method for use in audio communication between a talker and the other party in an environment with a high level of noise having a periodic pattern.

One or more exemplary embodiments relate to an audio playing apparatus for transmitting speech to a patient in an MRI noise environment, and more particularly, to a system designed to reproduce an audio signal such as speech and audio and actively attenuate MRI noise by using the structure of a non-magnet speaker (e.g., magnet-less speaker, speaker without a magnet, etc.) that operate normally both within and outside an MRI bore and an algorithm for operating the non-magnet speaker.

One or more exemplary embodiments include a noise reduction method for use in audio communication between patient and medical personnel in a magnetic resonance imaging (MRI) environment with a high level of noise having a period pattern, and an audio playing apparatus constructed to operate in all environments having magnetic fields of various strengths that are distributed inside/outside an MRI bore in order to provide extra services for a patient during an MRI scan. To achieve this, an audio playing apparatus having a non-magnet dynamic speaker that operates in an MRI magnetic field and an audio playing system including a control method and apparatus for maintaining a predetermined level of audio performance by adapting to changes in magnetic field strength are provided. The audio playing system is an MRI oriented system adapted to operate without regard to changes in magnetostatic field according to a position of a headset.

Additional aspects will be set forth in part in the description which follows and, in part, will be apparent from the description, or may be learned by practice of the presented embodiments.

According to an aspect of an exemplary embodiment, an audio apparatus includes: an input unit for receiving an audio signal containing noise; a period estimation unit for estimating a period of a noise pattern in the audio signal; a noise reduction unit for subtracting and removing the noise pattern from the audio signal in a frequency domain by using the estimated period of the noise pattern; a noise updating unit for updating the noise pattern according to a change in amplitude of the noise; and an output unit for outputting the audio signal obtained by removing the noise pattern.

The period estimation unit may acquire period information of the noise from a device that generates the noise, or calculate period information by using data in the audio signal acquired for a predetermined time.

The noise reduction unit may include a matching unit (e.g., a matching device, etc.) for matching the noise pattern with a timing index of a current frame in the audio signal and a calculator for removing a spectrum of a noise frame that is matched with the timing index of the current frame and removing residual noise via post-processing.

The noise updating unit may determine whether speech is present in a current frame in the audio signal, update the noise pattern and request the noise reduction unit to remove the noise pattern from the audio signal if the speech is not present in the current frame, determine whether an output signal obtained by removing the noise pattern is amplified to a greater extent than the input noise and diverges, and if the output signal diverges, request the period estimation unit to initialize information of the noise pattern.

According to an aspect of another exemplary embodiment, a method of reducing noise includes: receiving an audio signal containing the noise; estimating a period of a noise pattern in the audio signal; subtracting and removing the noise pattern from the audio signal in a frequency domain by using the estimated period of the noise pattern; updating the noise pattern according to a change in amplitude of the noise; and outputting the audio signal obtained by removing the noise pattern.

The estimating of the period of the noise pattern may include acquiring period information of the noise from a device that generates the noise, or calculating period information by using data in the audio signal acquired for a predetermined time.

The subtracting and removing of the noise pattern may include: matching the noise pattern with a timing index of a current frame in the audio signal; removing a spectrum of a noise frame that is matched with the timing index of the current frame; and removing residual noise via post-processing.

The updating of the noise pattern may include: determining whether speech is present in a current frame in the audio signal; updating the noise pattern and removing the noise pattern from the audio signal if the speech is not present in the current frame; determining whether an output signal obtained by removing the noise pattern is amplified to a greater extent than the input noise and diverges; and initializing information of the noise pattern if the output signal diverges.

According to an aspect of another exemplary embodiment, an audio playing apparatus includes: an audio output unit that is equipped with a non-magnet and outputs an audio signal; a selection unit for selecting a length of a coil or intensity of current according to a change in output of the non-magnet speaker due to a change in a strength of a magnetostatic field; and a reproduction unit for reproducing the audio signal by the selected length of the coil or the selected intensity of current.

The audio output unit may include a non-magnet dynamic transducer having a multi-coil with a plurality of lengths and an analysis sensor for measuring a change in output of the non-magnet speaker. The selection unit may select at least one selected from the multi-coil of the non-magnet dynamic transducer. The reproduction unit may reproduce the audio signal according to characteristics of the non-magnet dynamic transducer using the selected coil.

The multi-coil of the non-magnet dynamic transducer may include a plurality of annular coils that have different diameters and are connected to one vibration plate.

Coils in the multi-coil of the non-magnet dynamic transducer, which are connected to a vibration plate, may be divided into a plurality of coil groups, and the number of operating coil groups may vary according to selection by the selection unit.

The current intensity adjuster may include a variable resistance or resistance magnitude selector and a gain controller and adjust the intensity of current selected by the selection unit by selecting a magnitude of resistance.

According to an aspect of an exemplary embodiment, an active noise control method includes: selecting an output device according to a strength of a magnetostatic field that varies depending on a position of the output device; controlling a gain used in the selected output device; calculating an active noise control signal by reflecting the selected output device and the gain; and performing noise control by outputting the active noise control signal to the selected output device.

The selecting of the output device may include: operating a multi-coil in the output device in order from shortest to longest; analyzing an output signal acquired via an analysis sensor for measuring a response of the output device; determining whether distortion occurs due to deformation of a waveform of an output signal from a waveform of an input signal input to the output device and whether an output that is louder than noise may be reproduced; and selecting the shortest coil from among coils that can reproduce an output without causing distortion.

The selecting of the output device may include: operating resistances of a current intensity adjuster in the output device in order of magnitude from largest to smallest; analyzing an output signal acquired via an analysis sensor for measuring a response of the output device; determining whether distortion occurs due to deviation of a waveform of an output signal from a waveform of an input signal input to the output device and whether an output that is louder than noise may be reproduced; and selecting the largest one from among resistances at which an output can be reproduced without causing distortion.

The controlling of the gain may include calculating the gain based on information about input noise level and an output of a non-magnet dynamic transducer using a coil selected from among a multi-coil in the output device.

The controlling of the gain may include calculating the gain based on information about input noise level and an output using resistance selected from among resistances of a current intensity adjuster in the output device.

The calculating of the active noise control signal may include constructing a filter for generating the active noise control signal so as to reduce the amplitude of noise input via an analysis sensor for measuring a response of the selected output device, based on information about the noise and information about output characteristics between the analysis sensor and the selected output device.

The calculating of the active noise control signal may include calculating the active noise control signal by using a previously input fixed filter for the selected output device, based on information about output characteristics between an analysis sensor for measuring a response of the selected output device and the selected output device and information about noise input via the analysis sensor.

According to an aspect of another exemplary embodiment, a non-magnet speaker includes: a voice coil; a vibration plate connected to the voice coil; a vibration-absorbing portion that attached to one side of the vibration plate between a center and an edge of the vibration plate and absorbs vibrations generated by the vibration plate; and stoppers that are disposed on a front or rear surface of the non-magnet speaker so that they are separated from one another and support the vibration-absorbing portion attached to the vibration plate.

The vibration absorbing portion may be a damper made of a compressible material.

According to an aspect of another exemplary embodiment, an MRI system includes: a bore for generating a magnetic field; a first audio input device for receiving an audio signal containing speech of a first user located near the bore; a second audio input device for receiving an audio signal containing speech of a second user who controls the MRI system; a first output device for outputting the audio signal containing the speech of the second user to the first user via a non-magnet speaker; a second output device for outputting the audio signal containing the speech of the first user to the second user; an active noise control device that performs active noise control on the audio signal received by the second audio input device according to a strength of a magnetostatic field used in MRI and transmits the result to the first output device; and a noise reduction signal processor that estimates a noise pattern from the audio signal received by the first audio input device and removes the noise pattern in a frequency domain and transmits the result to the second output device.

The first audio input device may include a directional microphone.

According to an aspect of another exemplary embodiment, a method of reducing noise includes: receiving an audio signal containing noise generated by a magnetic resonance imaging (MRI) device; estimating a period of a noise pattern of noise; removing the noise pattern from the audio signal by using the estimated period of the noise pattern; and outputting the audio signal obtained by removing the noise pattern.

The estimating of the period of the noise pattern may include acquiring period information of the noise from the MRI device that generates the noise, or calculating period information by using data in the audio signal acquired for a predetermined time.

The removing of the noise pattern may include matching the noise pattern with a timing index of a current frame in the audio signal; removing a spectrum of a noise frame that is matched with the timing index of the current frame; and removing residual noise via post-processing.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1A:
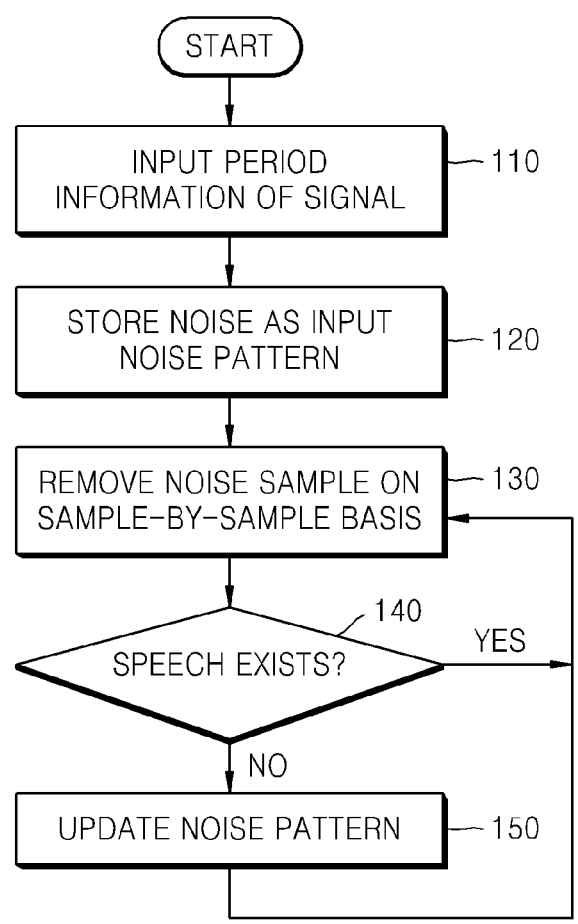
FIG. 1A is a flowchart of a method of processing noise for each sample in the time domain according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein; rather, these exemplary embodiments are provided so that this disclosure will be thorough and complete, and will fully convey the inventive concept to those skilled in the art, the scope of which is defined by the appended claims.

Accordingly, the exemplary embodiments are described below, by referring to the figures, to explain aspects of the present description.

Terms used herein will now be briefly described and then one or more exemplary embodiments will be described in detail.

General terms widely used are selected while considering functions in one or more exemplary embodiments for terms used herein, but the terms used herein may differ according to intentions of one of ordinary skill in the art, precedents, or emergence of new technologies. In some cases, an applicant arbitrarily selects a term, and in this case, the meaning of the term will be described in detail in the detailed description. Accordingly, the terms shall be defined based on the meanings and details throughout the specification, rather than the simple names of the terms.

When a part "includes" or "comprises" an element, the part may further other elements unless specified otherwise. The term "unit" used in the present specification refers to a software component, or a hardware component such as a field-programmable gate array (FPGA) or an application-specific integrated circuit (ASIC), and performs a certain function. However, the "unit" is not limited to software or hardware. The "unit" may be configured in an addressable storage medium and may be configured to operate one or more processors. Hence, the "unit" includes elements such as software elements, object-oriented software elements, class elements, and task elements, and processes, functions, attributes, procedures, sub-routines, segments of program codes, drivers, firmware, micro-codes, circuits, data, databases, data structures, tables, arrays, and variables. The functions provided in the elements and the units may be combined into a fewer number of elements and units or may be divided into a larger number of elements and units. Expressions such as "at least one of," when preceding a list of elements, modify the entire list of elements and do not modify the individual elements of the list.

Exemplary embodiments will now be described more fully hereinafter with reference to the accompanying drawings so that they may be easily implemented by one of ordinary skill in the art. In addition, certain descriptions are omitted to clarify the description of exemplary embodiments.

Among medical imaging technologies used in the medical field, magnetic resonance imaging (MRI) is mostly used since it has little adverse effects on a human body. However, MRI causes inconveniences to medical personnel and patients due to loud noise and long duration of the scan. During an MRI procedure, a patient may experience loud noise and fear and anxiety due to confinement within a narrow bore. A medical staff may also suffer stress because the medical staff hears MRI noise and speech together while monitoring a patient's condition.

To block noise heard by a patient inside a scan room, the patient is required to wear an earplug or earmuff. However, use of an earplug or earmuff may prevent the patient from verbally communicating with the medical staff without reducing noise heard by the medical staff. In addition, this method may cause severe discomforts in communication in an environment that suffers from high levels of noise such as a helicopter or jet engine noise or noise in factories.

One or more exemplary embodiments include a method that enables bi-directional audio communication while attenuating noise having periodicity by using a noise reduction technique and an active noise control (ANC) device. The method allows transmission of an audio signal that cancels out noise by applying a noise reduction technique and enables a talker to hear speech of the other party while attenuating noise heard by the talker by means of an ANC device. By using the method, a talker may continuously monitor the other party's condition, and communicate with the other party, e.g., by inquiring about a current status.

As cutting-edge imaging equipment such as computed tomography (CT), MRI, and ultrasound devices have advanced, the need and importance of medical imaging is increasing. MRI devices are being more widely used since they provide more pieces of information for a doctor or patient by showing a clearer image of a detailed human body structure than other types of devices and are not harmful to a human body. With the development of an MRI technology, MRI devices may provide a more precise image within a shorter time by using a more powerful magnetic field. However, as a magnetic field strength increases, the MRI noise becomes louder. A high level of noise above 100 dB produced by an MRI scan may cause great inconvenience to patients and damage an auditory organ due to the long duration of the scan. Thus, there is a need for apparatuses or methods capable of protecting an auditory organ in an MRI scanning environment with a high level of noise or allowing an examinee to listen to external audio or music.

One or more exemplary embodiments include a method that enables bi-directional audio communication and provision of extra services while attenuating an MRI noise heard by a medical staff member and patient for a long duration by using an noise cancellation technique and an ANC headset, speaker system, or display, and an apparatus for playing back an audio signal such as speech and audio and actively attenuating an MRI noise by using the structure of a non-magnet speaker (e.g., magnet-less speaker, speaker without a magnet, etc.) that operates normally both within or outside an MRI bore and an algorithm for operating the non-magnet speaker. A patient's audio signal that cancels out an MRI noise by using a noise cancellation technique is transmitted to the medical staff in a control room, and a patient wearing an ANC headset listens to the speech of the medical staff via the ANC headset. By using the exemplary method and apparatus, the medical staff may continuously monitor a patient's condition, and the patient may communicate with the medical staff, e.g., by asking about the current status of an MRI scan. Furthermore, by using the method and apparatus, during an MRI scan, multimedia content may be provided to a patient, a doctor may perform remote diagnosis of a patient, or services that provide various supplementary information customized for a patient may be provided.

According to a noise reduction method and a communications method for use in an MRI environment, a patient's audio signal containing an MRI noise is input via a microphone within a scan room, a noise component is removed from the input signal for each sample, and the resulting signal is output to a control room. Another approach may include transmitting speech of a patient to the medical staff by using an earplug-type input/output device and enabling the patient to listen to an audio signal from outside a scan room. In this case, noise reduction is accomplished through an ANC technique that uses a signal input via a microphone located on the outside of the earplug.

In one or more exemplary embodiments, a non-magnet dynamic speaker using a strong magnetic field generated by an MRI procedure is used as a speaker for reproducing audio in an MRI environment. The non-magnet dynamic speaker does not use a magnet and generates sound when a vibration plate moves due to the Lorentz force produced between a magnetostatic field and current flowing through a voice coil. Without a permanent magnet used in a general speaker, the non-magnet dynamic speaker may effectively reproduce a wide spectrum of sounds by using strong mangnetostatic fields present in the MRI environment.

Other services that may be provided during an MRI scan may include entertainment services for relaxing a patient by using a display device/head-mounted audio playing apparatus and provision of feedback such as information about a patient's movement through communication between the patient and doctor.

In an MRI environment with a high level of noise and a negative signal-to-noise ratio (SNR) due to a long distance between a talker and a microphone for acquiring audio, it is difficult to transmit audio and to effectively reduce noise because noise is louder than audio. Furthermore, because a technique for determining the presence of an audio signal is not precise in the MRI environment, updating a noise component to be removed is limited in terms of its use.

Figure 1B:
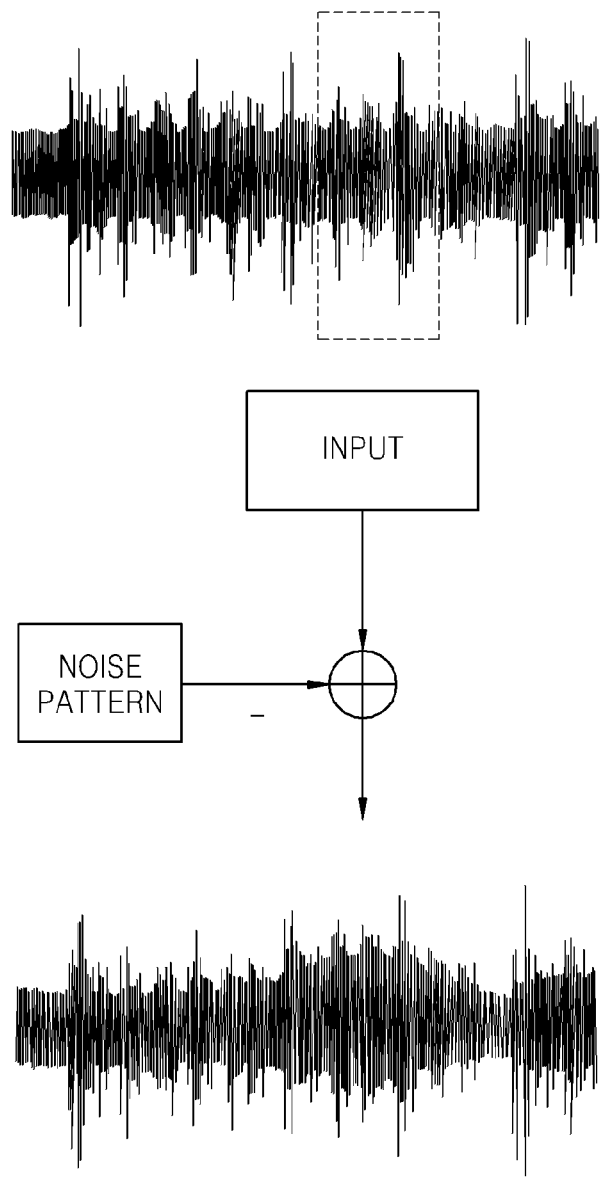
FIG. 1B illustrates the result of a noise reduction simulation using a method of processing noise for each sample in the time domain.

FIG. 1A is a flowchart of a method of processing noise for each sample in the time domain according to an exemplary embodiment, and FIG. 1B illustrates the result of a noise reduction simulation using a method of processing noise for each sample in the time domain. In FIG. 1B, upper and lower waveform diagrams illustrate waveforms of an input signal and an output signal, respectively.

Referring to FIG. 1A, period information of an input signal is input (operation 110).

Noise from the input signal is stored as a periodic noise pattern (operation 120).

A sample of a noise pattern is removed from the input signal in the time domain on a sample-by-sample basis (operation 130).

The presence of speech or audio other than noise in the input signal is determined (operation 140). If the audio is determined to be present, the process returns to operation 130 for processing a next sample.

If the audio is not present in operation 140, only noise may be determined to exist, and the noise pattern is updated (operation 150). Then, the process returns to operation 130 for processing a subsequent sample.

However, when noise from an input signal is stored as a periodic noise pattern and noise reduction is performed on each sample in the time domain as illustrated in FIG. 1A, noise in a portion of the input signal that does not match the noise pattern may not be effectively reduced, but rather be amplified as illustrated in FIG. 1B. Furthermore, according to the method of FIG. 1A, a determination is not performed on whether an output signal diverges. 'Divergence' of the output signal means that the output signal is amplified to a greater extent than an input signal, as shown in FIG. 1B.

Figure 2A:
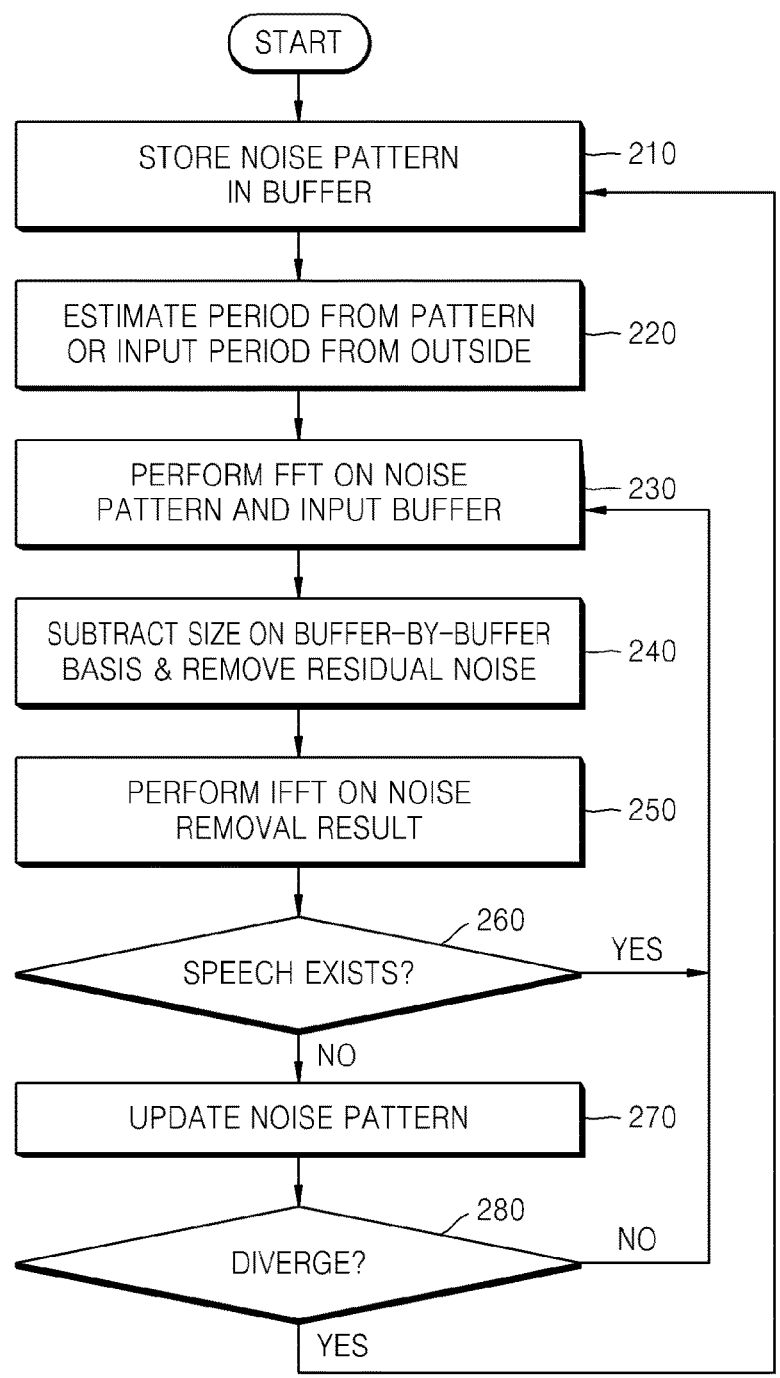
FIG. 2A is a flowchart of a method of processing noise for each buffer (or frame) in the frequency domain according to an exemplary embodiment.
Figure 2B:
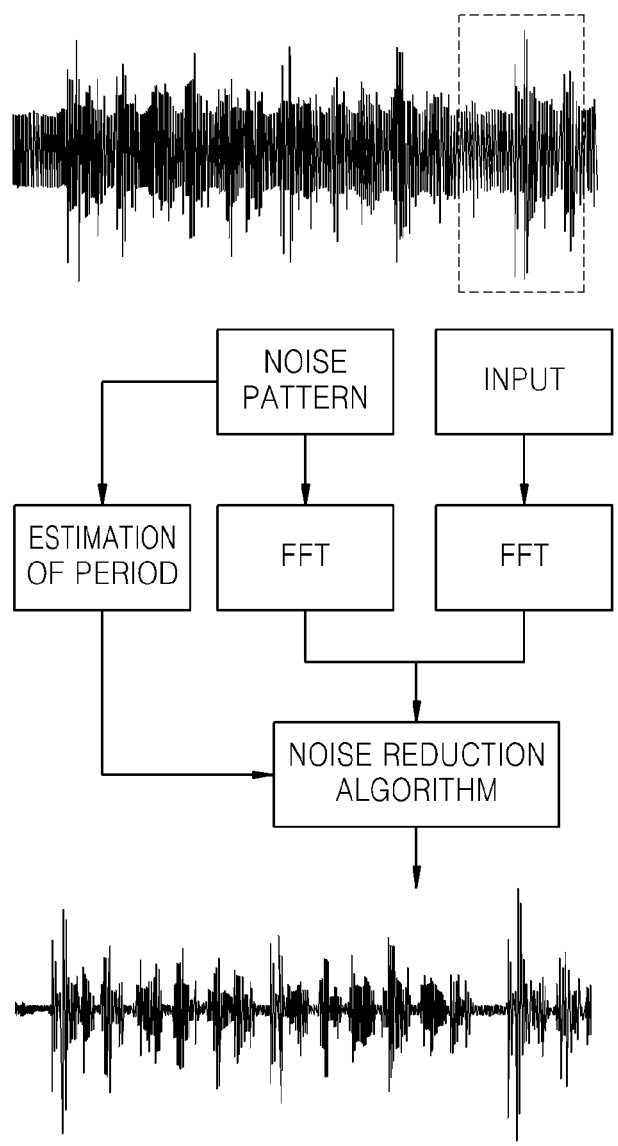
FIG. 2B illustrates the result of a noise reduction simulation using a method of processing noise for each buffer (or frame) in the frequency domain according to an exemplary embodiment.

FIG. 2A illustrates a method of processing noise for each buffer (or frame) in the frequency domain according to an exemplary embodiment, and FIG. 2B illustrates the result of a noise reduction simulation using the method of FIG. 2A according to an exemplary embodiment. In FIG. 2B, upper and lower waveform diagrams illustrate waveforms of an input signal and an output signal, respectively.

Referring to FIG. 2A, a noise pattern is stored in a buffer (operation 210).

A period of noise is estimated from the noise pattern, or may be input from an external source (operation 220).

Fast Fourier Transform (FFT) is performed on the noise pattern and an input buffer to convert the noise pattern and the input buffer into the frequency domain (operation 230).

A size of the noise pattern is subtracted from the input buffer on a buffer-by-buffer basis, and residual noise may be further removed from the result of subtraction (operation 240).

Inverse FFT (IFFT) is performed on the result of noise reduction to convert the result of noise reduction into the time domain (operation 250).

The presence of speech or audio other than noise in the input signal is determined (operation 260). If the audio is present, the process returns to operation 230 for processing a next buffer.

If the audio is not present in operation 260, only noise may be determined to exist, and the noise pattern is updated (operation 270).

It is determined whether the updated noise pattern diverges (operation 280). If the updated pattern is used to reduce noise, an output signal is significantly amplified, or diverges compared to an input signal. Thus, to estimate a period of the noise pattern, the process returns to operation 210.

If the updated noise pattern does not diverge, the process returns to operation 230 for processing a subsequent buffer by using the updated noise pattern.

When noise is processed for each buffer (or frame) in the frequency domain as shown in FIG. 2A, a non-diverging output signal may be obtained by reducing noise from the input signal as illustrated in FIG. 2B.

Figure 3:
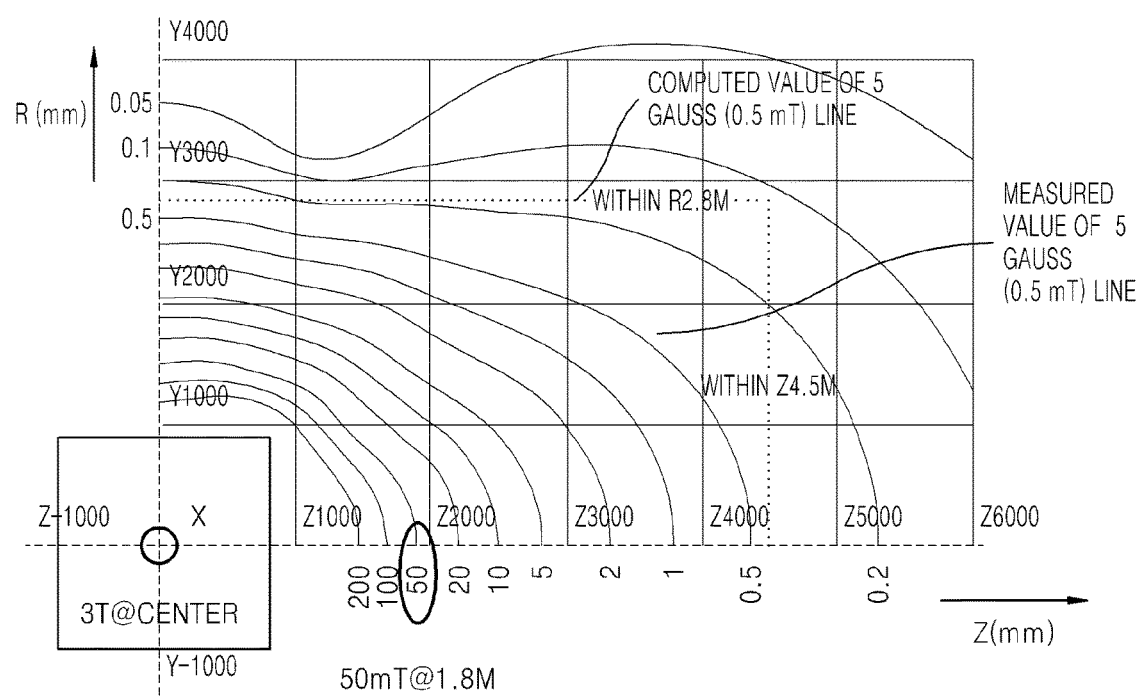
FIG. 3 illustrates a change in the strength of a magnetic resonance imaging (MRI) magnetostatic field according to a position.

FIG. 3 illustrates a change in the strength of an MRI magnetostatic field according to a position. In FIG. 3, if a patient lies in an MRI bore with the patient's head at the center of the MRI bore, the axis of abscissa (Z) may correspond to a direction from the center of the MRI bore toward an entry thereof, i.e., the patient's legs. The axis of ordinate (R, Y) may be a radial direction from the center of the MRI bore, or a direction perpendicular to a surface of the earth. A direction (X-axis direction) passing through a surface of paper may be a radial direction from the center of the MRI bore and a direction horizontal to the surface of the earth. A value of each stray field line represents Gauss. The stray field lines are represented by 0.05→0.1→0.2→0.5→1→2→5→10→20→50→100→200 mT in order, from outside to inside.

Since a non-magnet dynamic speaker uses a magnetostatic field created within an MRI bore, the strength of the magnetostatic field significantly affects an output of the non-magnet dynamic speaker. However, FIG. 3 shows that the strength of magnetostatic field decreases sharply away from the center of the MRI bore outside the MRI bore. For example, in a 3 Tesla (T) MRI scanner, a strength of magnetostatic field at a distance that is about 1.8 m away from the center of the MRI bore decreases to 50 mT that is equal to one sixtieth of a strength of magnetostatic field at the center of the MRI bore.

FIGS. 4A through 4H illustrate results of active noise reduction performance tests performed on a non-magnet speaker according to a position.

Figure 4A:
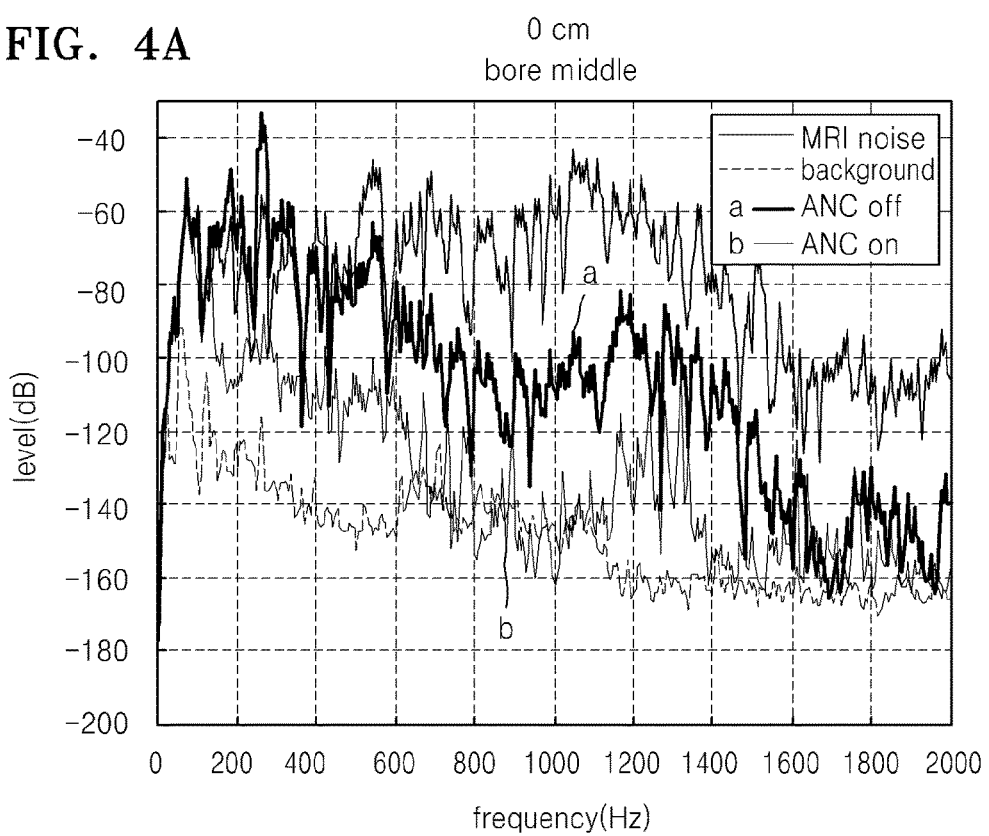
FIGS. 4A through 4H illustrate results of active noise reduction performance tests on a non-magnet speaker according to a position.
Figure 4B:
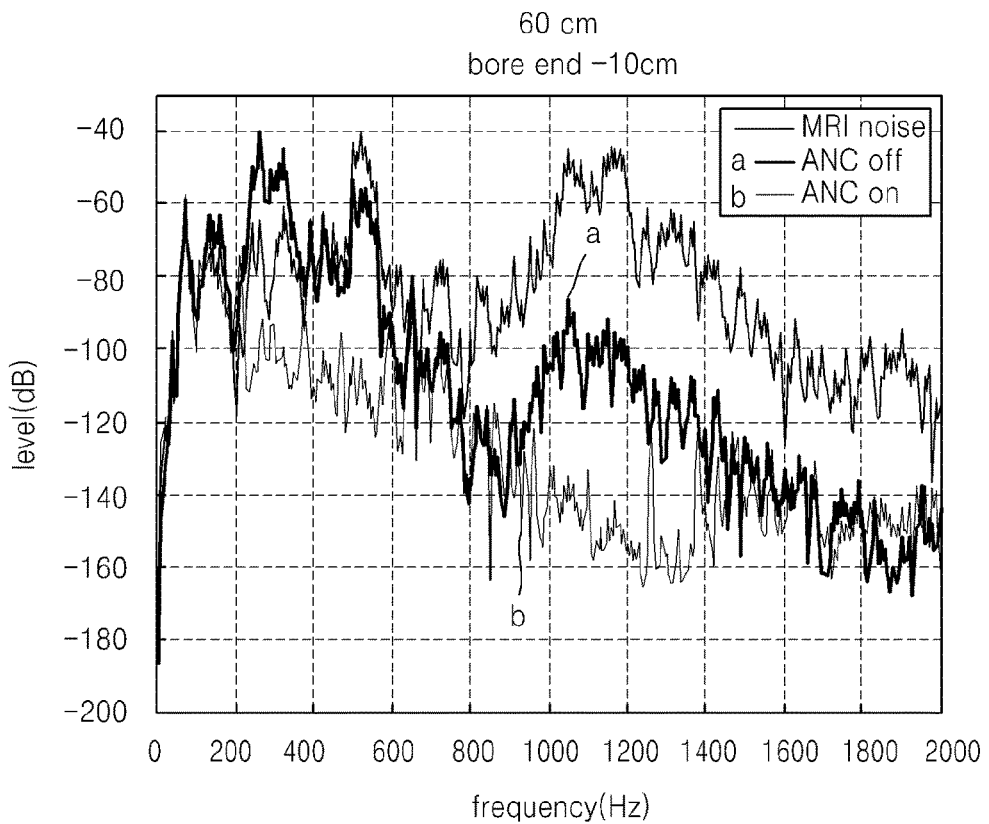
Figure 4C:
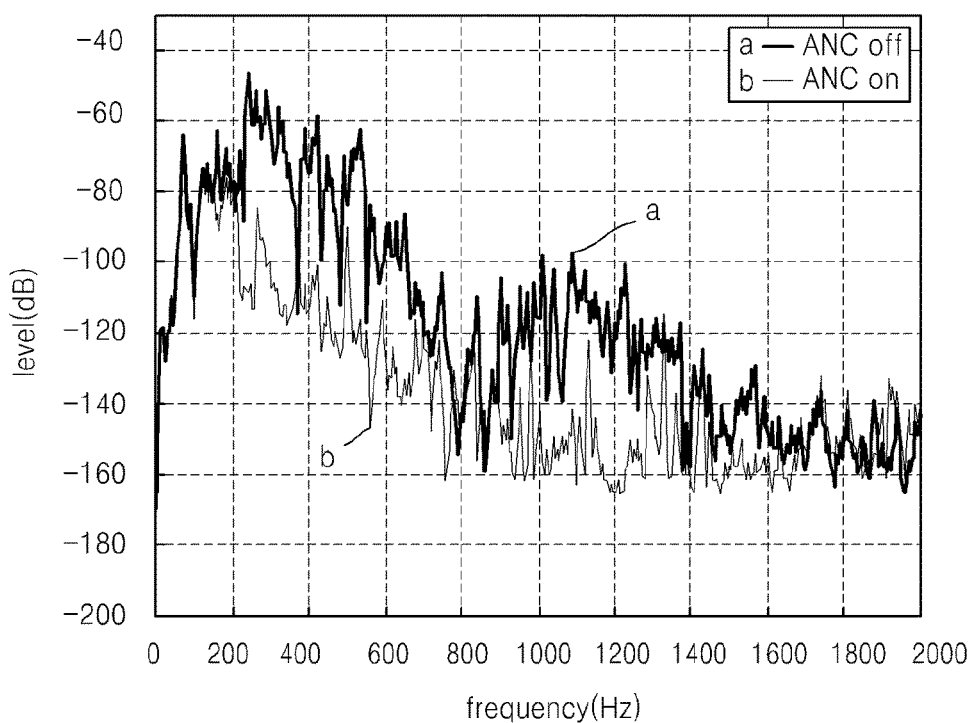
Figure 4D:
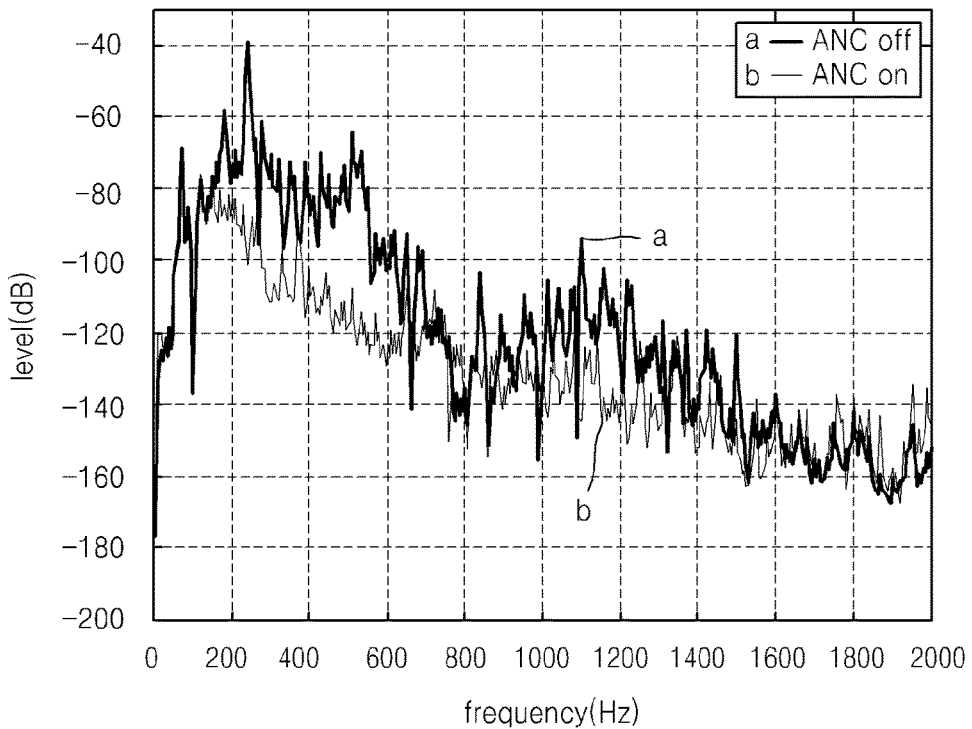
Figure 4E:
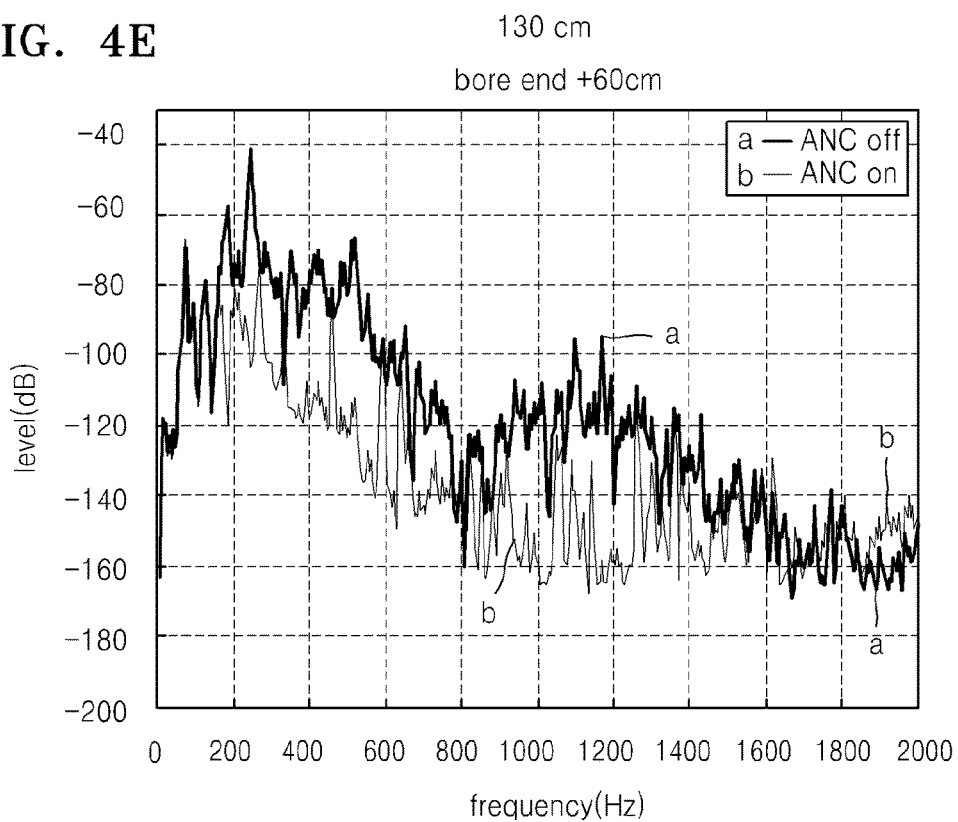
Figure 4F:
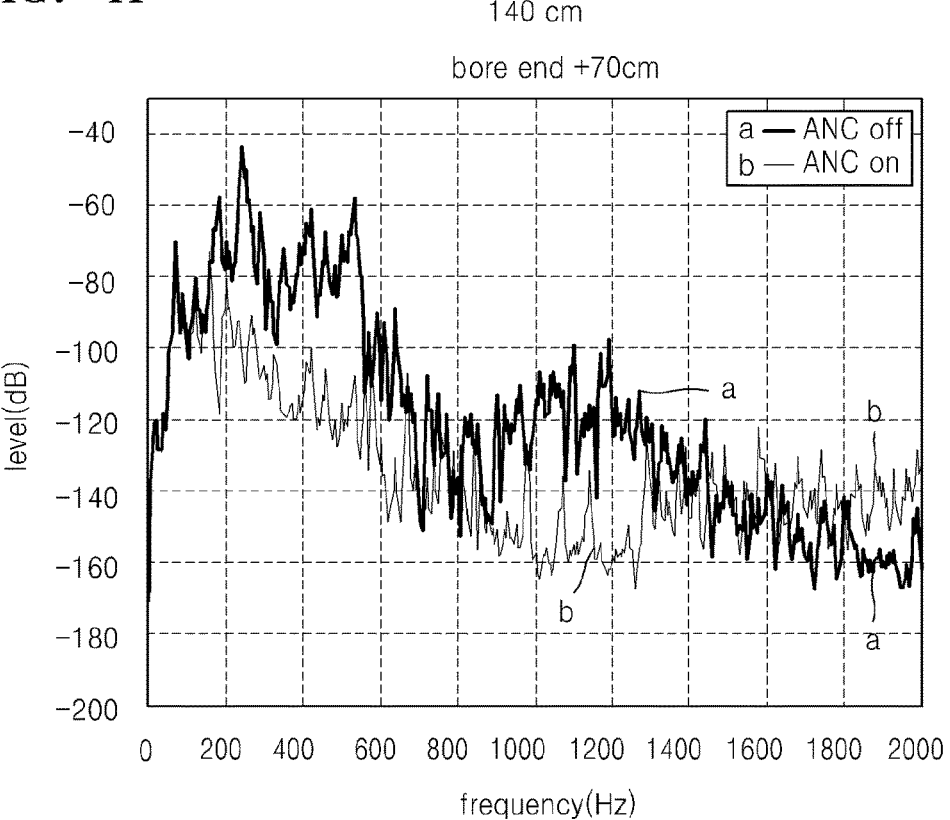
Figure 4G:
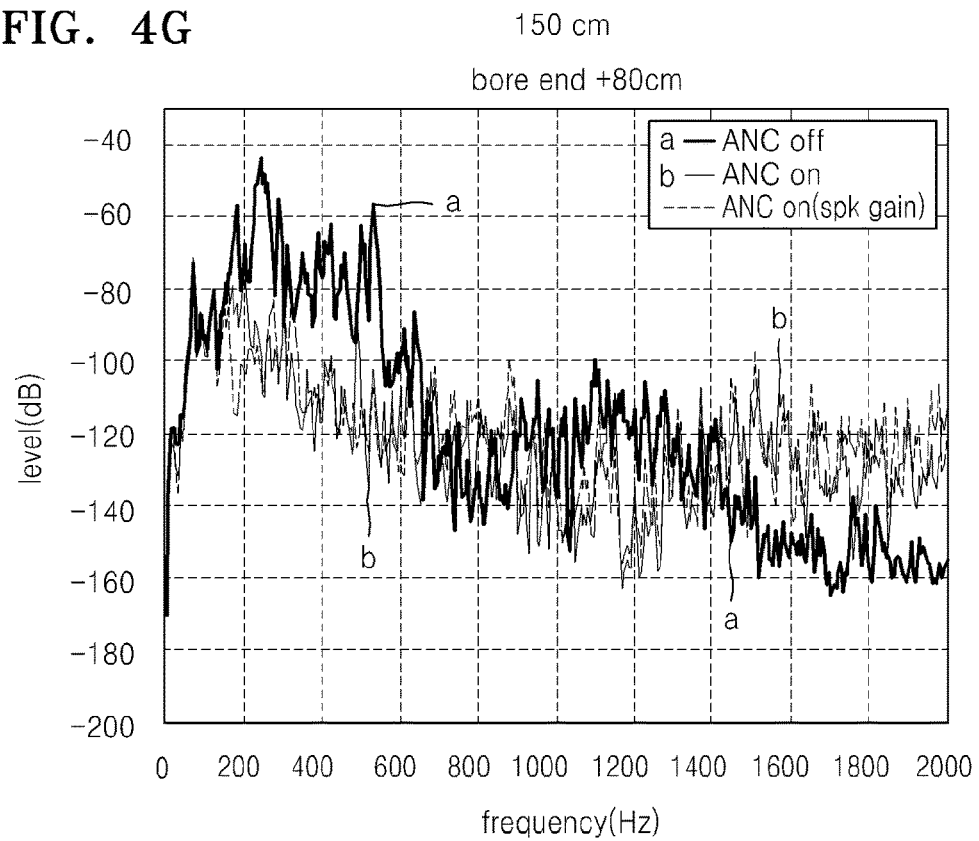
Figure 4H:
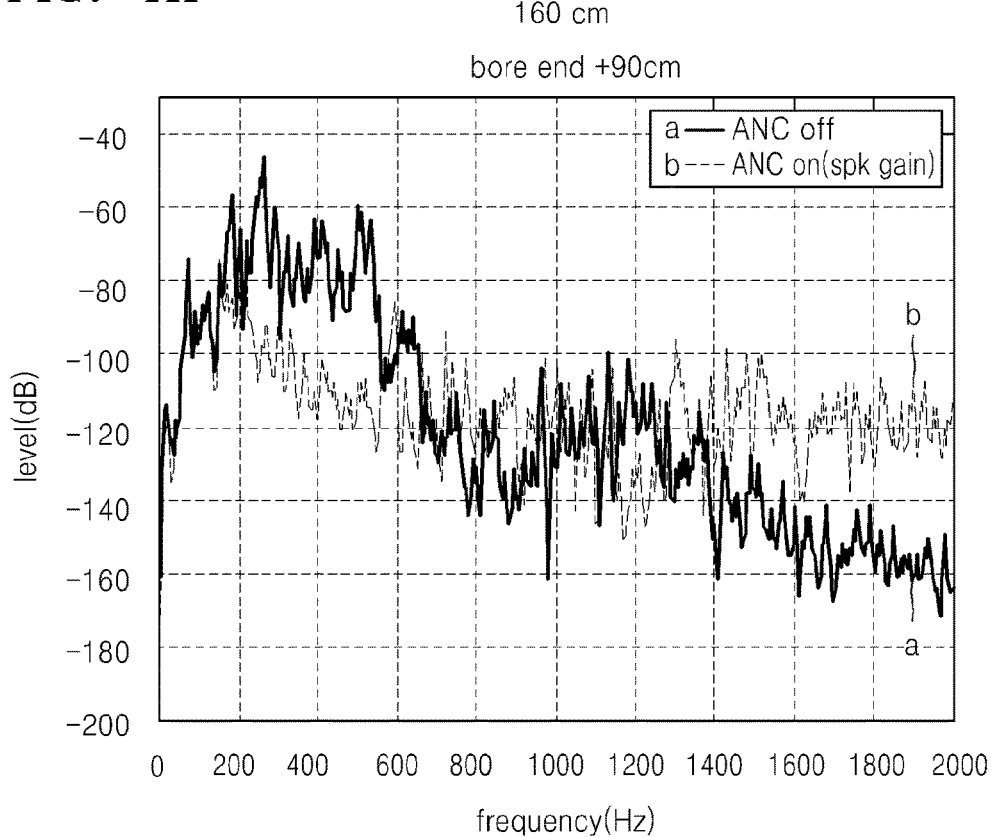

FIGS. 4A and 4B illustrate results of active noise reduction performance tests at a position of a center of a bore (0 cm away from the center of the bore) and at a position that is 10 cm away from an end of the bore toward the inside thereof (60 cm away from the center of the bore), respectively. FIGS. 4C through 4H illustrate results of active noise reduction performance tests at positions that are 20 cm, 50 cm, 60 cm, 70 cm, 80 cm, and 90 cm away from the end of the bore toward the outside thereof (90 cm, 120 cm, 130 cm, 140 cm, 150 cm, and 160 cm away from the center of the bore), respectively. In FIGS. 4A through 4H, 'ANC off' A and 'ANC on' B denote MRI noises produced when noise active reduction is not performed and when noise active reduction is performed, respectively.

FIGS. 4A through 4H show that noise is reduced to a greater extent when the noise active reduction is performed ('ANC on' B) than when the noise active reduction is not performed ('ANC off' A). However, as a distance from the center of the bore increases, a difference between outputs, i.e., levels of noises indicated by 'ANC off' A and 'ANC on' B, decreases. Furthermore, FIGS. 4E through 4H show that a level of noise indicated by 'ANC on' B becomes higher than that indicated by 'ANC off' A in a high frequency region.

A speaker does not produce sufficient power output outside an MRI bore due to a low magnetic field strength therein. Thus, as shown in FIGS. 4E through 4H, when MRI is performed on a patient's knee or feet with the patient's head outside the MRI bore, a distortion may occur because the speaker fails to produce a power output corresponding to an amplitude of the MRI noise. The distortion from the speaker eventually leads to a failure to reproduce a normal audio signal or degrades the ANC performance. As evident from FIGS. 4E through 4H, as a distance from the MRI bore increases, noise in a signal containing MRI noise, which is indicated by A, has a higher level than noise in a signal from which MRI noise is reduced, which is indicated by B, away from the MRI bore.

Services such as multimedia content may be provided to a patient during MRI scanning in a passive mode that the patient is not free to choose the content, and be limited to a range of contents input to an entertainment system in advance of providing the contents.

Figure 5:
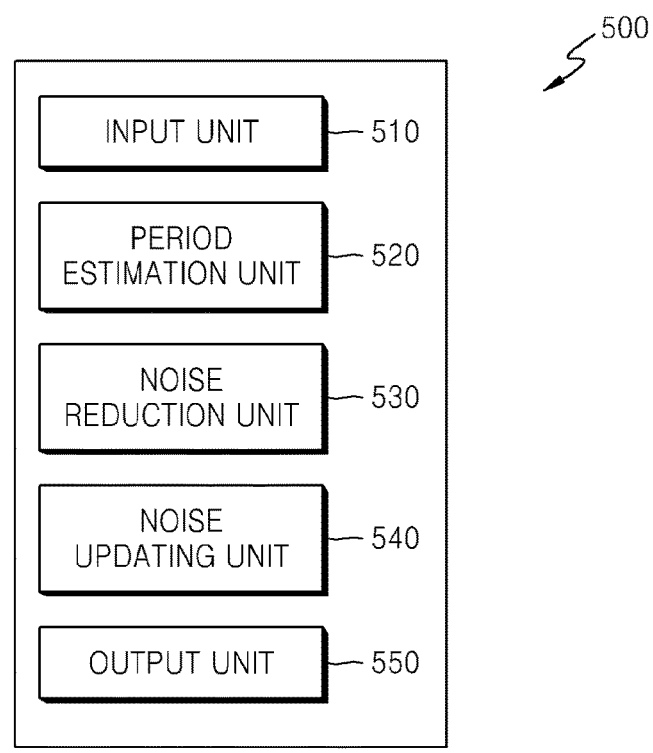
FIG. 5 is a block diagram of an audio apparatus according to an exemplary embodiment.

FIG. 5 is a block diagram of an audio apparatus 500 according to an exemplary embodiment.

Referring to FIG. 5, the audio apparatus 500 according to the present exemplary embodiment includes an input unit 510 (e.g., an input device, an input, etc.), a period estimation unit 520 (e.g., a period estimator, a period estimation device, etc.), a noise reduction unit 530 (e.g., a noise reducer, a noise reduction device, etc.), a noise updating unit 540 (e.g., a noise updater, a noise updating device, etc.), and an output unit 550 (e.g., an output, an output device, etc.).

The input unit 510 receives an audio signal containing noise. The input unit 510 may include a microphone and receives an audio signal that is recorded on a storage medium or transmitted via a network.

The period estimation unit 520 estimates a period of a noise pattern in an audio signal. The period estimation unit 520 may acquire period information of noise from a noise generating device or calculate period information by using data in an audio signal acquired for a predetermined time.

The noise reduction unit 530 subtracts and removes a noise pattern from an audio signal in the frequency domain by using an estimated period of the noise pattern. To do so, the noise reduction unit 530 may include a matching unit (e.g., a matching device) for matching the noise pattern with a timing index of a current frame in the audio signal and a calculator for removing a spectrum of a noise frame that is matched with the timing index of the current frame and removing residual noise via post-processing.

The noise updating unit 540 updates a noise pattern according to a change in amplitude of noise. The noise updating unit 540 also determines whether speech is present in a current frame in an audio signal. If the speech is not present in the current frame, the noise updating unit 540 updates the noise pattern. The noise updating unit 540 requests the noise reduction unit 530 to remove the noise pattern from the audio signal.

The noise updating unit 540 also determines whether an output signal obtained by removing a noise pattern is amplified to a greater extent than input noise and diverges. If the output signal diverges, the noise updating unit 540 requests the period estimation unit 520 to initialize information of the noise pattern. 'Divergence' of the output signal means that the output signal is amplified to a greater extent than an input signal, as shown in FIG. 1B.

The output unit 550 may output an audio signal obtained by removing the noise pattern. The output unit 550 may include a speaker for outputting an audio signal as a sound, and record the audio signal on a storage medium or transmit it via a network.

In one or more exemplary embodiments, an apparatus for enabling a talker (e.g., a patient) to communicate with the other party includes an audio input device consisting of at least one microphone for acquiring a talker's speech, an audio playing apparatus incorporating an ANC function for cancelling outside noise while playing an audio signal, and a noise reduction system for reducing noise from an input audio signal. Furthermore, an apparatus for enabling the other party to communicate with a talker (e.g., a patient) may include an audio input device consisting of at least one microphone for acquiring the other party's speech and a speaker or headphone for reproducing sounds delivered to the other party.

Noise Reduction for Audio Communication

An audio signal is obtained by reducing noise from a signal input to an input device from a talker via a noise reduction system, transmitted to the other party, and played for the other party via a speaker or headset device. A signal input to an input device from the other party is also transmitted and output to an ANC device or speaker worn by a patient or mounted on a part of a patient's body.

Figure 6:
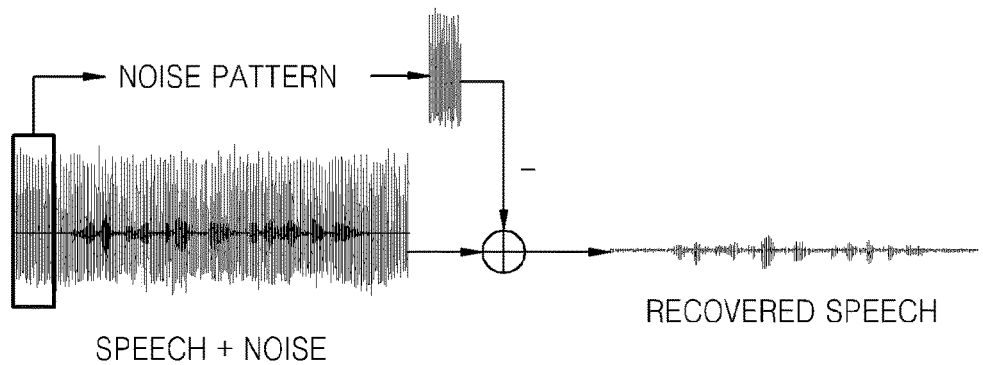
FIG. 6 is a diagram for explaining a signal processing method for reducing noise having periodicity according to an exemplary embodiment.

FIG. 6 is a diagram for explaining a signal processing method for reducing noise having periodicity according to an exemplary embodiment. As shown in FIG. 6, a noise reduction system for removing a noise signal from an audio signal input to an input device is a signal processor designed to extract periodical properties of a noise signal by analyzing in real-time period information of noise input from a device that generates periodic noise and the noise signal input via a microphone and to transmit only an audio signal by removing only the noise signal from an input signal based on information about the extracted periodical properties.

According to the method of FIG. 1A, previously stored noise is subtracted from a current input signal in the time domain. The method of FIG. 1A has a problem in that a noise signal may not be reduced but rather amplified if a noise pattern corresponding to a current sample value does not coincide with a stored noise pattern in the time domain.

In one or more exemplary embodiments, as illustrated in FIG. 2A, information about periodicity properties of a noise signal that are analyzed previously or in real-time is acquired. Furthermore, noise signal data in a frame corresponding to each period of a noise signal is acquired. The noise signal is input for each frame that is a form suitable for audio signal processing. The noise signal data is obtained by performing frequency processing. Then, a spectrum of a signal corresponding to a current frame is removed by using the information about periodicity properties and the noise signal data. Thus, even when a pattern corresponding to the current frame does not accurately coincide with a stored noise pattern, noise is not amplified, and an algorithm operates robustly. To process the stored noise signal data by matching it with timing information of the current frame, periodicity properties may be determined by identifying period information of a periodic noise using a periodic pattern or processing period information of noise input via a device in the time or frequency domain.

Figure 7:
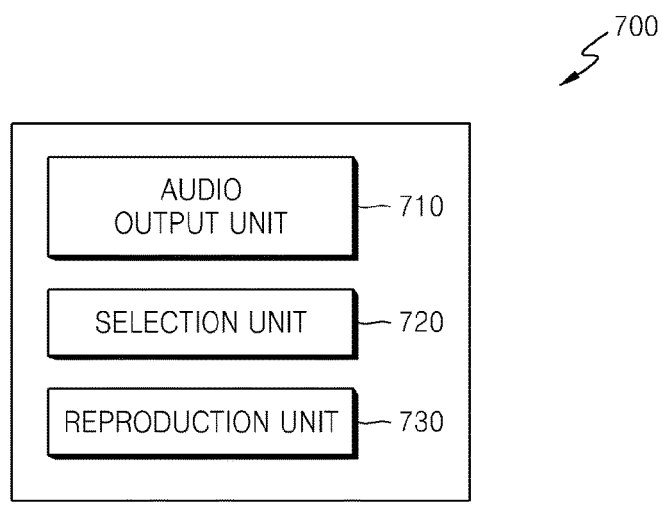
FIG. 7 is a block diagram of an audio playing apparatus according to an exemplary embodiment.

FIG. 7 is a block diagram of an audio playing apparatus 700 according to an exemplary embodiment.

Referring to FIG. 7, the audio playing apparatus 700 includes an audio output unit 710 (e.g., an audio output, an audio output device, a speaker, etc.), a selection unit 720 (e.g., a selector, a selection device, etc.), and a reproduction unit 730 (e.g., a reproducer, a reproduction device, etc.).

The audio output unit 710 is equipped with a non-magnet speaker and outputs an audio signal. The audio output unit 710 may include a non-magnet dynamic transducer having a multi-coil unit with a plurality of lengths, e.g., multiple voice coils, and an analysis sensor, e.g., a microphone for measuring a change in power output of a non-magnet speaker, a response of the speaker, and a noise level. The multi-coil unit includes a plurality of annular coils having different diameters and connected to one vibration plate. The multi-coil unit may operate by dividing the annular coils into a plurality of coil groups. The number of operating coil groups may vary according to the selection by the selection unit 720.

The audio output unit 710 may include a non-magnet dynamic transducer having a current intensity adjuster for adjusting the intensity of current flowing through voice coils. The current intensity adjuster may include a variable resistance or resistance magnitude selector and a gain controller and adjust the intensity of current that is selected by the selection unit 720 through selection of a magnitude of resistance.

The selection unit 720 selects a length of a coil or intensity of current according to a change in power output of a non-magnet speaker due to a change in the strength of magnetostatic field. The selection unit 720 may select at least one from among the multi-coil unit for adjustment by a coil length adjuster. The selection unit 720 may also select the intensity of current to be adjusted by the current intensity adjuster.

The reproduction unit 730 plays back an audio signal by using a selected length of a coil or selected current intensity. The reproduction unit 730 may reproduce an audio signal according to characteristics of the non-magnet dynamic transducer using a selected coil or selected current intensity.

Figure 8:
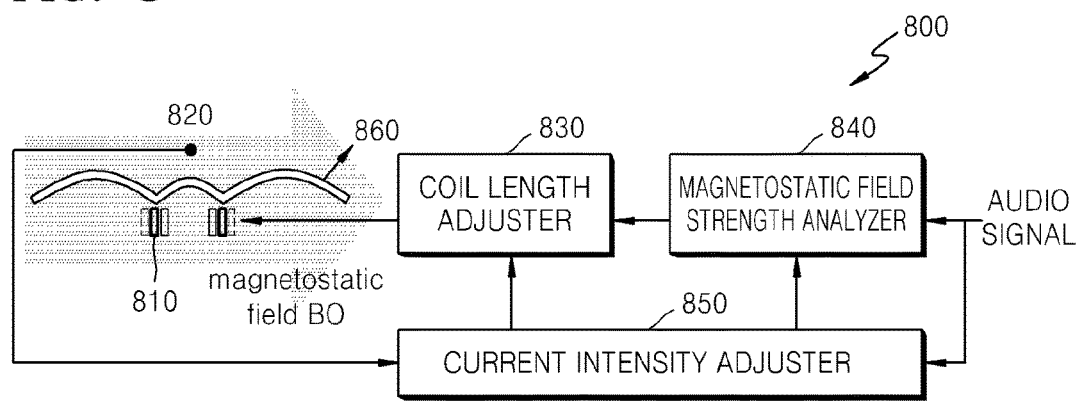
FIG. 8 is a detailed block diagram of an audio playing apparatus according to an exemplary embodiment.

FIG. 8 is a detailed block diagram of an audio playing apparatus 800 according to an exemplary embodiment.

Referring to FIG. 8, the audio playing apparatus 800 according to the present exemplary embodiment using a non-magnet dynamic speaker in an MRI environment includes the non-magnet dynamic speaker having a multi voice coil 810, a coil length adjuster 830, a current intensity adjuster 840, and a magnetostatic field strength analyzer 850.

The non-magnet dynamic speaker includes the multi voice coil 810. The non-magnet dynamic speaker may further include an analysis sensor 820, e.g., a microphone for measuring a speaker response and a noise level. The multi voice coil 810 includes a plurality of annular coils that may be connected to one vibration plate 860.

The coil length adjuster 830 may adjust the entire length of a coil selected from among the multi voice coil 810 by inputting an audio signal to be output to the selected coil.

The current intensity adjuster 840 may adjust the intensity of current through selection of magnitude of resistance.

The magnetostatic field strength analyzer 850 may determine the intensity of current or length of a coil according to the strength of a magnetic field.

Components of the audio playing apparatus 800 will now be described in more detail with reference to FIGS. 9 through 14.

1) Non-Magnet Dynamic Speaker Including the Multi Voice Coil 810

Figure 9:
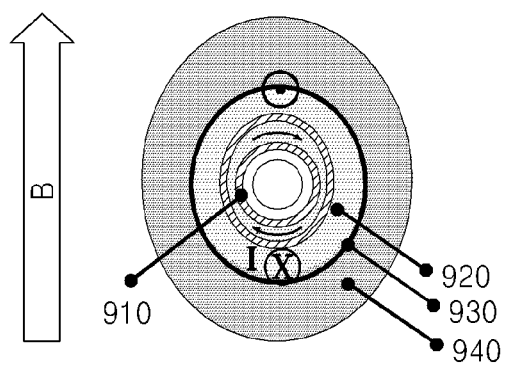
FIG. 9 illustrates the direction of an MRI magnetic field and a structure of a non-magnet dynamic speaker.

FIG. 9 illustrates the direction of an MRI magnetic field and a structure of the non-magnet dynamic speaker. Referring to FIG. 9, the non-magnet dynamic speaker includes a vibration plate 920 for generating sounds and a voice coil 910 for moving the vibration plate 920. In particular, the voice coil 910 may be implemented in a multi-layered coil to have various coil lengths. The non-magnet dynamic speaker may further include a speaker frame 930 and a headset case 940 that support and protect operating part of the non-magnet dynamic speaker and are necessary for use and appearance of the non-magnet dynamic speaker.

Figure 10:
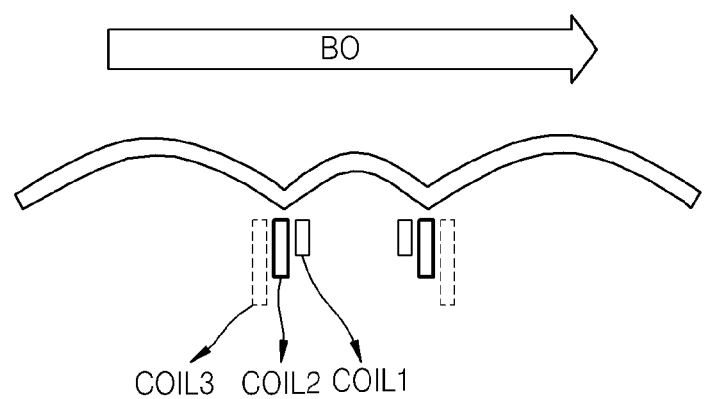
FIG. 10 illustrates a multi-layered coil of a non-magnet dynamic speaker according to an exemplary embodiment.

FIG. 10 illustrates a multi-layered coil of a non-magnet dynamic speaker according to an exemplary embodiment.

Referring to FIG. 10, when the voice coil 910 shown in FIG. 9 is implemented in a multi-layered coil, the voice coil 910 may have different diameters and a different number of turns.

Figure 11:
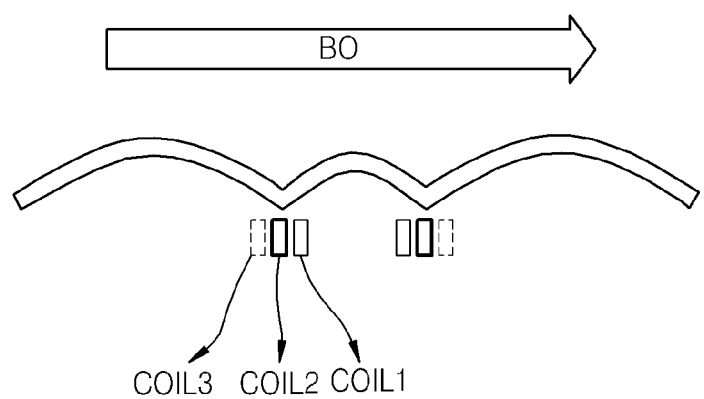
FIG. 11 illustrates a multi-layered coil of a non-magnet dynamic speaker according to another exemplary embodiment.

FIG. 11 illustrates a multi-layered coil of a non-magnet dynamic speaker according to another exemplary embodiment. Referring to FIG. 11, the voice coil 910 may be implemented by overlapping a plurality of annular voice coils with the same diameter and the same number of turns.

An input signal is input from the coil length adjuster 830 shown in FIG. 8 and then applied to each coil in a multi-layered voice coil. Each of the coils is connected to a single vibration plate, and all of the coils are arranged with their central axes oriented not parallel to a direction of magnetostatic field BO used in MRI.

Non-magnet dynamic speakers using the multi-layered voice coils shown in FIGS. 9 through 11 may be mounted on a head-set type or non-headset type output device. In a headset type output device, a vibration plate of a non-magnet dynamic speaker is disposed toward a human ear. In a non-headset type output device, a non-magnet dynamic speaker may be mounted toward a human ear and on a structure such as a headrest disposed near a human head.

2) Coil Length Adjuster 830

The coil length adjuster 830 shown in FIG. 8 serves to input an audio signal to an input portion of the multi-layered voice coil. The audio signal will then be output to a coil selected from among the multi-layered voice coil. By selecting the coil, the entire length of the coil may be adjusted.

3) Current Intensity Adjuster 840

Figure 12:
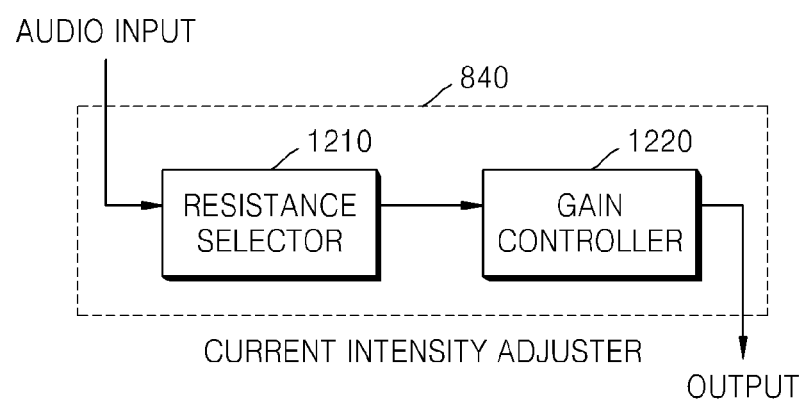
FIG. 12 is a block diagram of a current intensity adjuster for a non-magnet dynamic speaker shown in FIG. 8 according to an exemplary embodiment.

FIG. 12 is a block diagram of the current intensity adjuster 840 for the non-magnet dynamic speaker shown in FIG. 8 according to an exemplary embodiment. Referring to FIG. 12, the current intensity adjuster 840 includes a resistance selector 1210 for selecting a variable resistance or magnitude of resistance and a gain controller 1220 and may adjust the intensity of current by selecting the magnitude of resistance. The current intensity adjuster 840 maintains an output of the non-magnet dynamic speaker by changing the intensity of current flowing through a voice coil attached to a vibration plate in an MRI environment having magnetic fields with various strengths. To do so, the current intensity adjuster 840 may use a variable resistance and may change the intensity of current flowing through the voice coil due to a change in resistance according to a strength of magnetostatic field.

Magnetostatic Field Strength Analyzer 850

Figure 13:
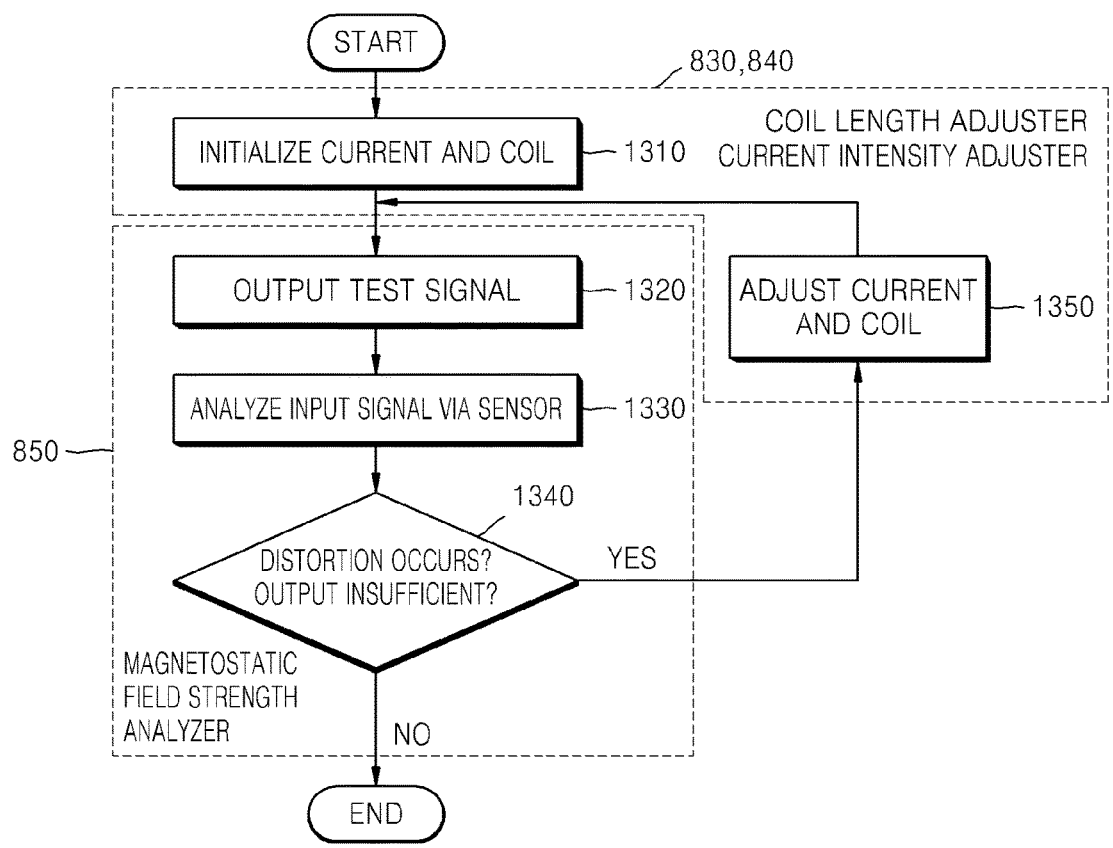
FIG. 13 is a flowchart for explaining an operation of a magnetostatic field strength analyzer shown in FIG. 8 according to an exemplary embodiment.

FIG. 13 is a flowchart for explaining an operation of the magnetostatic field strength analyzer 850 shown in FIG. 8 according to an exemplary embodiment. The magnetostatic field strength analyzer 850 may determine current intensity or a coil length according to a magnetic field strength. To do so, the magnetostatic field strength analyzer 850 may select a coil or current intensity by using information about a magnetic field strength.

Referring to FIGS. 8 and 13, the coil length adjuster 830 initializes a coil length (i.e., selection of a coil), or the current intensity adjuster 840 initializes the intensity of current flowing through a coil (operation 1310).

The magnetostatic field strength analyzer 850 outputs a test signal to a speaker (operation 1320).

The magnetostatic field strength analyzer 850 analyzes an input signal fed via a sensor, e.g., a microphone near a vibration plate of the speaker. Thus, an output of the speaker may be analyzed through the sensor (operation 1330).

The magnetostatic field strength analyzer 850 may determine whether distortion occurs or an output of the speaker is insufficient, based on the result of analysis in operation 1330 (operation 1340).

If distortion occurs, or the output is insufficient, the coil length adjuster 830 adjusts a coil length, or the current intensity adjuster 840 adjusts the intensity of current flowing through a coil in order to resume analysis of a magnetostatic field strength (operation 1350).

On the other hand, if distortion does not occur, or the output is sufficient, the magnetostatic field strength analyzer 850 may determine current intensity or a coil length based on the result of analysis of the magnetostatic field strength.

By using the method of FIG. 13, a coil or current intensity may be selected according to a magnetostatic field strength via a sensor such as a microphone mounted near a vibration plate of a speaker.

5) Damper for Vibration Plate of Non-Magnetic Speaker

Figure 14:
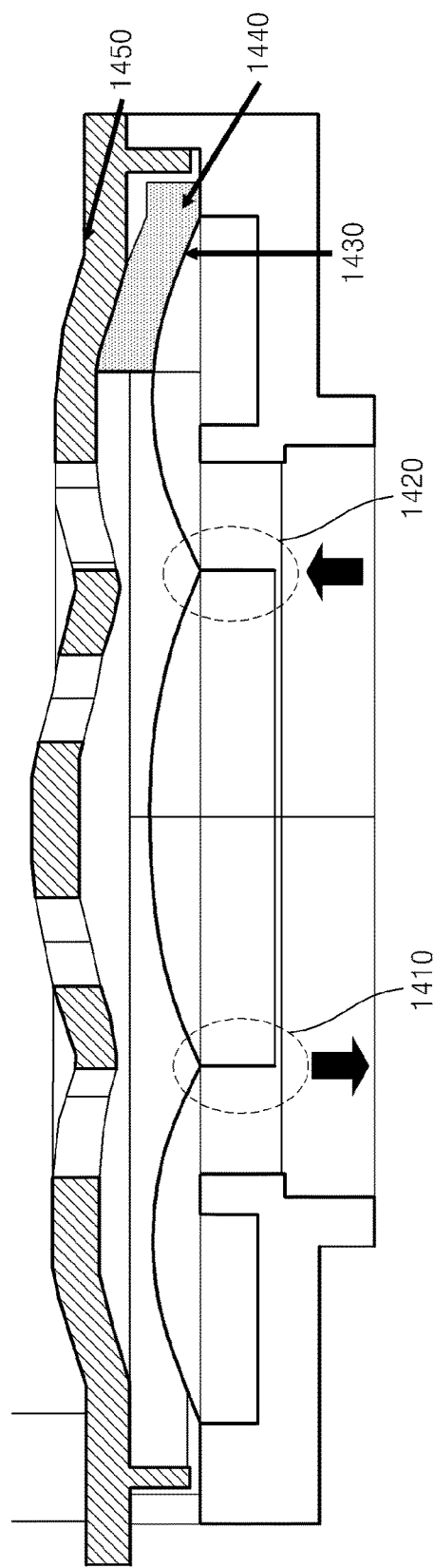
FIG. 14 illustrates the structure of a damper and a stopper for a non-magnet speaker according to an exemplary embodiment.

FIG. 14 illustrates the structure of a damper and a stopper for a non-magnet speaker according to an exemplary embodiment. The non-magnet speaker is disposed so that a vibration plate 1430 and central axes of voice coils are oriented toward a human ear, e.g. is perpendicular to a magnetostatic field. The non-magnet speaker simultaneously generates an operation mode in which a first semi-circular voice coil portion 1410 descends toward the central axis and an operation mode in which a second semi-circular voice coil portion 1420 ascends in the direction opposite the central axis, thereby eliminating the resultant force that moves the voice coils. Thus, the entire voice coil has a motion mode in which it only rotates without being linearly moved.

A circumference of the voice coil is fixedly attached to the vibration plate 1430, and a support force of the vibration plate 1430 is not uniform along the circumference of the voice coil due to a difference in material elastic rebound forces due to a shape of the vibration plate 1430. Thus, although the vibration plate 1430 performs a linear movement locally, vibration generated by the vibration plate 1430 is small in magnitude and local vibrations cancel out each other. Thereby, it is not possible to smoothly reproduce sounds. To allow the voice coil to reproduce sounds according to a positive/negative current signal, the voice coil needs to move up or down with large displacements in parallel to its central axis. By bounding motion of one semi-circular voice coil portion (e.g., the second semi-circular voice coil portion 1420) while moving the other semi-circular voice coil portion (e.g., the first semi-circular voice coil portion 1410), sounds may be reproduced due to movement of displacement of the voice coil.

Referring to FIG. 14, in order to bound the motion of the second semi-circular voice coil portion, a vibration-absorbing portion, i.e., a damper 1440 such as a highly deformable sponge having predetermined elasticity is attached to one side of the vibration plate 1430. For the same purpose, a stopper 1450 is also mounted above the damper 1440 and serves as a rigid barrier wall made of a rigid body such as plastic. By forming a damper (1440)-stopper (1450) structure in a direction that the vibration plate 1430 moves up, it is possible to suppress torsional vibration of the vibration plate 1430 and perform an up-and-down linear motion to a greater extent. In this case, a distance between the damper 1440 and the stopper 1450 and a thickness and a density of the damper 1440 may be important factors. When upward movement of the vibration plate 1430 is hampered by the damper (1440)-stopper (1450) structure with an excessive force, it is difficult to reproduce a certain range of frequencies due to distortion or abnormal deformation of the vibration plate 1430. Conversely, when the distance between the damper 1440 and the stopper 1450 is so large that upward movement of the vibration plate 1430 is hampered with very small or little force, audio output is extremely low. Furthermore, since the weight of the damper 1440 attached to the vibration plate 1430 affects a natural frequency of the vibration plate 1430 as well as a change in frequency response characteristics, the damper 1440 may have appropriate size and weight according to the mechanical shape and structure of the vibration plate 1430.

Methods of reducing noise according to exemplary embodiments will now be described with reference to FIGS. 15 and 16.

Figure 15:
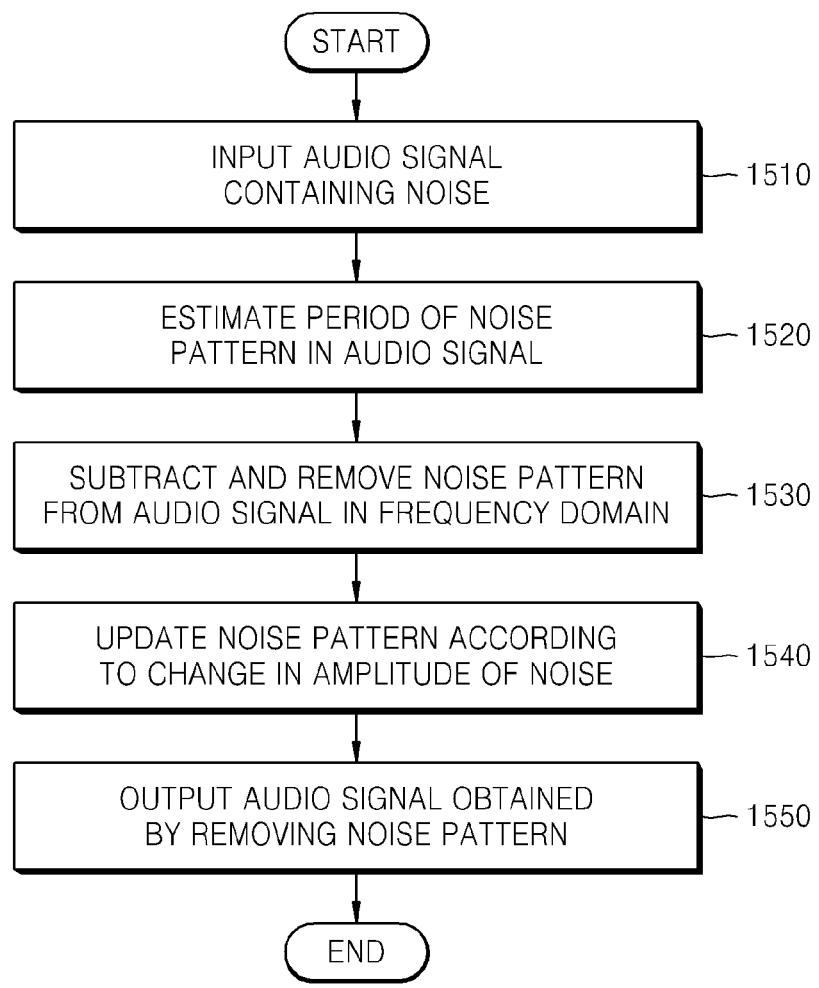
FIG. 15 is a flowchart of a method of reducing noise according to an exemplary embodiment.

FIG. 15 is a flowchart of a method of reducing noise according to an exemplary embodiment.

Referring to FIG. 15, an audio signal containing noise is received (operation 1510).

A period of a noise pattern in an audio signal is estimated (operation 1520). In this case, period information of noise may be acquired from a noise generating device, or period information may be calculated using data in an audio signal acquired for a predetermined time.

Noise may be reduced by subtracting the noise pattern from the audio signal in the frequency domain by using the estimated period of the noise pattern (operation 1530). Operation 1530 may include matching the noise pattern with a timing index of a current frame in the audio signal and removing a spectrum of the noise frame that is matched with the timing index of the current frame, and removing residual noise via post-processing.

The noise pattern is updated according to a change in amplitude of noise (operation 1540). Operation 1540 may include determining whether speech is present in the current frame in the audio signal, updating the noise pattern if the speech is not present in the current frame or removing the noise pattern from the audio signal, determining whether an output signal obtained by removing the noise pattern is amplified to a greater extent than input noise and diverges, and initializing information of the noise pattern if the output signal diverges.

An audio signal obtained by removing the noise pattern is output (operation 1550).

Figure 16:
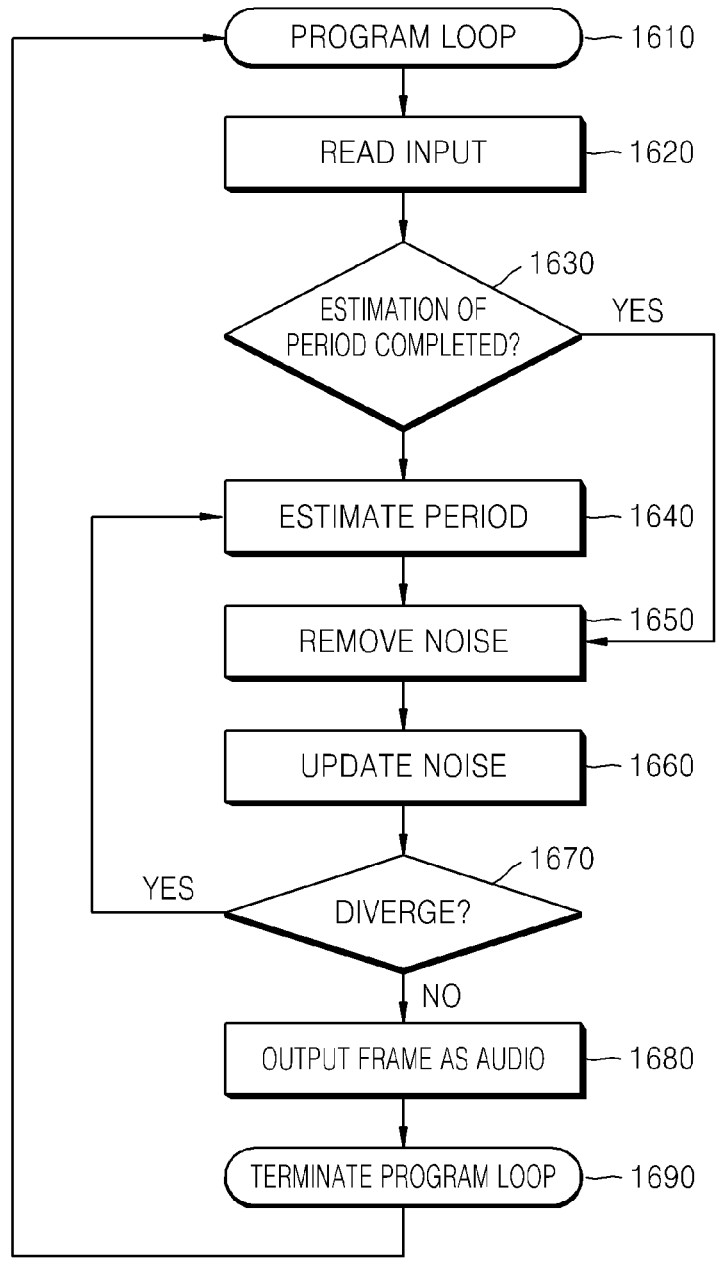
FIG. 16 is a flowchart of a noise reduction algorithm for use in audio communication according to an exemplary embodiment.

FIG. 16 is a flowchart of a noise reduction algorithm for use in audio communication according to an exemplary embodiment.

Figure 17:
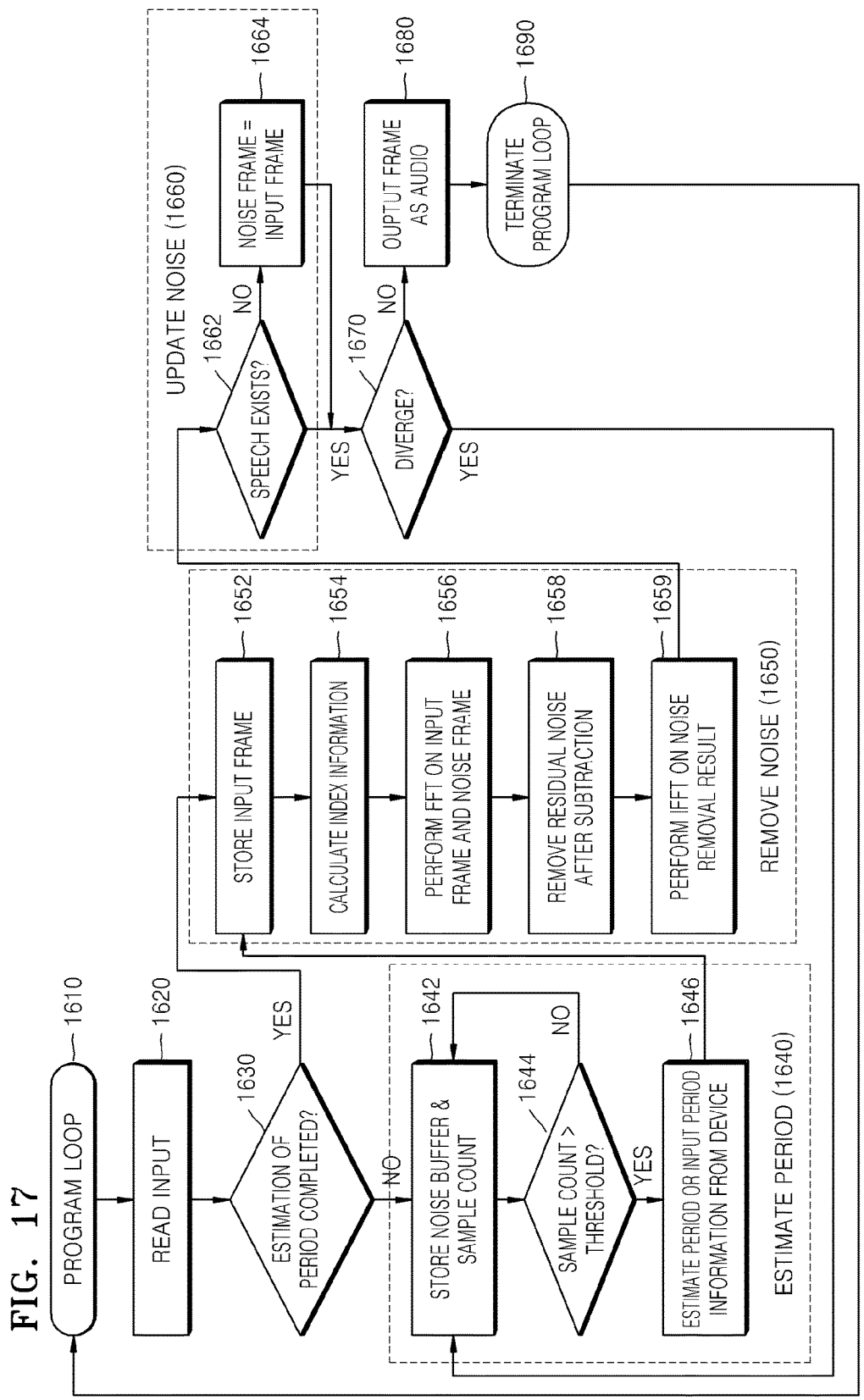
FIG. 17 is a detailed flowchart of a noise reduction algorithm for use in audio communication according to an exemplary embodiment.

FIG. 17 is a detailed flowchart of a noise reduction algorithm for use in audio communication according to an exemplary embodiment. FIG. 17 illustrates operation 1640 (estimation of a period), operation 1650 (noise reduction), and operation 1660 (updating of noise) in more detail.

Acquisition of Speech by a Talker (e.g., Patient)

Speech of a talker and a noise signal are simultaneously acquired via a microphone and input for noise reduction. For example, a patient's voice and a noise signal may be simultaneously acquired in an MRI scan room via a microphone and input for cancelling out noise. In this case, since an MRI environment has a high level of noise, a talker's speech (e.g., patient's speech) is input at a lower level than noise. Thus, in one or more exemplary embodiments, a directional microphone is used to increase an SNR.

Noise Cancellation for Audio Communication

A noise reduction algorithm for use in audio communication according to an exemplary embodiment will now be described in detail with reference to FIGS. 16 and 17.

Referring to FIGS. 16 and 17, a program loop, i.e., a noise reduction algorithm for use in audio communication starts (operation 1610). The program loop may be performed in an iterative way, e.g., by ending in operation 1690 and going back to operation 1610 as shown in FIGS. 16 and 17.

The noise reduction algorithm according to the present exemplary embodiment is performed on an input signal obtained during the above-described acquisition of speech by a talker (operation 1620).

It is determined whether estimation of a period is completed (operation 1630). If the estimation of a period is not completed, the estimation of a period is performed operation 1640). If the estimation of a period is completed, noise reduction is performed (operation 1650).

When the noise reduction algorithm operates to estimate a period in operation 1640, an input signal is stored in a noise buffer, and a sample count begins (operation 1642).

In order to store the input signal in the noise buffer to a sufficient size and estimate a period, the input signal is repeatedly stored in the noise buffer until a sample count reaches a predetermined threshold, e.g., is greater than the predetermined threshold (S1644)

The period may be estimated by calculating a period of noise input via the noise buffer, or period information may be received from a system of a noise generating device for storage (operation 1646).

Then, noise reduction is performed (operation 1650)

When storage of the period information is completed in operation 1646, an input signal is stored on a frame by frame basis (operation 1652). In this case, when a size of a frame is small, distortion in noise reduction may be suppressed.

To perform signal processing on a small frame, information about timing of the noise buffer when a current frame matches with a noise pattern stored in the noise buffer, i.e., index information is calculated using Equation (1) below (operation 1654):

$$\text{Index} = \text{mod}(\text{count}, \text{period value}) \qquad (1)$$

where "Index" denotes information about timing of the noise buffer when a current frame matches with the noise pattern stored in the noise buffer.

An input frame and a noise buffer signal corresponding to a frame size, the timing of which is matched with the input frame by using the index information, are converted into the frequency domain, and magnitudes of the input frame and the noise buffer signal are calculated (operation 1656). This conversion may be accomplished by performing FFT on the input frame and the noise buffer signal.

An audio signal is separated by subtracting a noise pattern signal from an input signal by using the calculated magnitudes (operation 1658), as given by Equation (2) below:

$$\hat{S}(e^{jw}) = [|X(e^{jw})| - N(e^{jw})] e^{jwx(e^{jw})} \qquad (2)$$

where $\hat{S}(e^{jw})$ is estimated speech, $X(e^{jw})$ is audio containing noise, and $N(e^{jw})$ is a noise pattern signal.

After removing residual noise from the separated audio signal, the result of noise reduction is converted into the time domain, e.g., by performing IFFT (operation 1659).

Next, noise information is updated (operation 1660).

The presence of speech in the current frame is determined (operation 1662). If the speech is not present in the current frame, noise information is updated by replacing the current frame in the noise buffer with the input frame (operation 1664).

It is determined whether an output diverges (operation 1670).

If the output diverges in operation 1670, the method returns to operation 1640 to perform estimation of a period.

On the other hand, if the output does not diverge in operation 1670, the current frame is output as audio (operation 1680), and the program loop ends (operation 1690). When the program loop ends in operation 1690, the method returns to operation 1610 for iteration of the program loop.

Reproduction of the Other Party's Speech and Content

The other party's speech is acquired via another audio input device, and the speech is output while ANC is being performed via a speaker that is mounted in an output device incorporating an ANC function and worn by a talker.

An exemplary embodiment includes an audio system that is adapted to operate everywhere in an MRI environment by changing current intensity or an entire length of a lead wire according to a strength of magnetostatic field (BO) in MRI that varies from position to position. A speaker in the audio system produces audio by using a phenomenon where current flowing through a lead wire moves when being subjected to a force generated by an ambient magnetic field, as shown in Equation (3):

$$F = I \int dl \times B \qquad (3)$$

where F is a force acting on a coil, L is a length of a lead wire, and I is current flowing through the lead wire.

Furthermore, a magnetic field B in Equation (3) above is a basically strong factor in an MRI environment. A non-magnet dynamic speaker uses a magnetostatic field in MRI instead of a general magnet. However, since the magnetostatic field varies from position to position, force F exerted on a voice coil varies according to a position. In an environment where a strength of magnetic field B varies in this way, according to one or more exemplary embodiments, the length L of the lead wire or the current I flowing through the lead wire are changed in order to constantly maintain the force F exerted on the voice coil.

Figure 18:
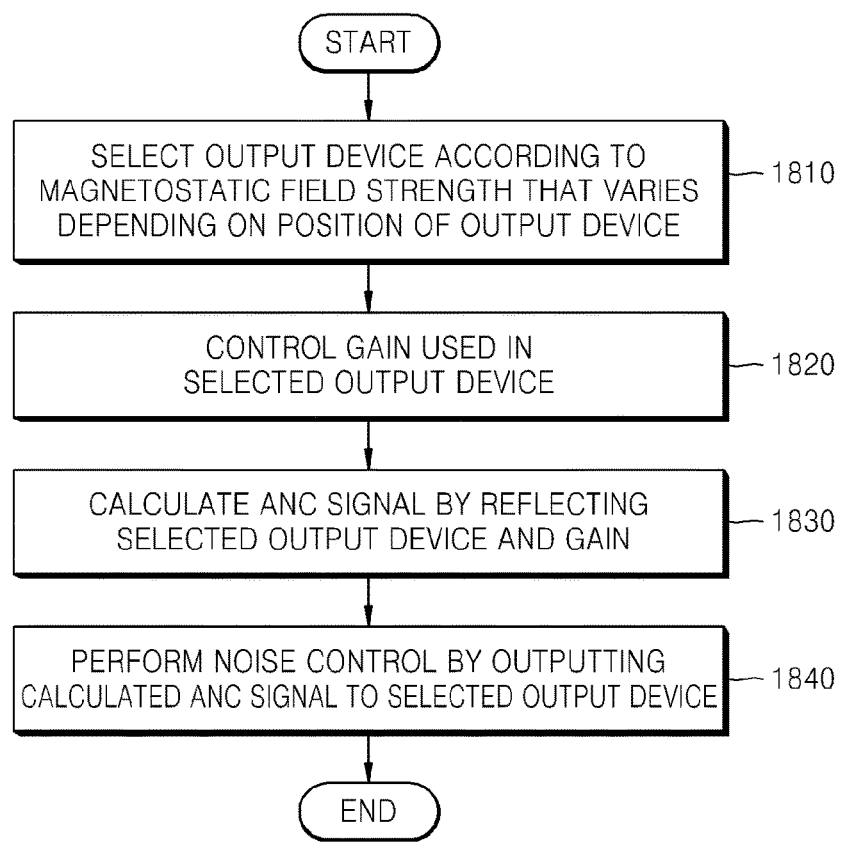
FIG. 18 is a flowchart of an active noise control (ANC) method according to an exemplary embodiment.

Operation related to this will now be described with reference to FIG. 18. FIG. 18 is a flowchart of an ANC method according to an exemplary embodiment.

Referring to FIG. 18, an output device is selected according to a strength of a magnetostatic field that varies depending on a position of the output device (operation 1810).

Operation 1810 may include operating a multi-coil in the output device in order from shortest to longest, analyzing an output signal acquired via an analysis sensor, e.g., a microphone for measuring a response of the output device, determining whether distortion occurs due to the deformation of a waveform of an output signal from a waveform of an input signal input to the output device and whether an output signal may be reproduced louder than noise, and selecting the shortest coil from among coils that can reproduce an output without causing distortion.

Alternatively, operation 1810 may include operating resistances of a current intensity adjuster in the output device in order of magnitude from largest to smallest, analyzing an output signal acquired via an analysis sensor, e.g., a microphone for measuring a response of the output device, determining whether distortion occurs due to the deformation of a waveform of an output signal from a waveform of an input signal input to the output device and whether an output signal may be reproduced louder than noise, and selecting the largest one from among resistances at which an output signal can be reproduced without causing distortion.

A gain used in the selected output device is controlled (operation 1820). Operation 1820 may include calculating a gain based on an output of a non-magnet dynamic transducer using a coil selected from among a multi-coil in the output device as well as information about input noise level. Alternatively, operation 1820 may include calculating a gain based on an output using resistance selected from among resistances of a current intensity adjuster in the output device and information about input noise level.

An ANC signal is obtained using the selected output device and the controlled gain (operation 1830). Operation 1830 may include constructing a filter for generating an ANC signal so as to reduce the amplitude of noise input via an analysis sensor, e.g., a microphone for measuring a response of the output device, based on information about output characteristics between the analysis sensor and the selected output device and information about the noise. Alternatively, operation 1830 may include calculating an ANC signal by using a previously input fixed filter for the selected output device based on information about output characteristics between an analysis sensor, e.g., a microphone for measuring a response of the selected output device and the selected output device and information about noise input via the analysis sensor.

Noise control is performed by outputting the calculated ANC signal to the selected output device (operation 1840).

An ANC method will now be described in more detail.

First, a coil length and a current intensity appropriate for a magnetostatic field strength are selected. Then, an audio having a power suitable for the magnetostatic field strength is output using the selected coil length and current intensity. A coil length and a current intensity appropriate for a magnetostatic field strength may be selected using information about the magnetostatic field strength previously analyzed according to a position. The previously analyzed information is used by determining a coil length or current intensity appropriate for a magnetostatic field strength previously measured for each position as illustrated in FIG. 3 and then changing the coil length and the current intensity according to a position of a speaker.

Alternatively, a coil length or current intensity may be automatically determined using a sensor such as a microphone. When a speaker is located within a magnetostatic field used in MRI and starts to operate, a process of automatically selecting a current intensity and a coil according to a magnetostatic field strength begins. First, a coil with the shortest length is selected from among a multi-coil, e.g., including coil 1 through coil 3 with different lengths as shown in FIG. 10. A previously input test signal is then input to a system, and a signal produced as an output of a speaker is received via a sensor such as a microphone. The received signal is analyzed to determine whether distortion of a speaker occurs and measure an amplitude of an output of the speaker. If distortion occurs, or an output of the speaker is insufficient, a coil having the next shortest length is selected since a magnetostatic field used in MRI has a low strength. An input signal fed via a microphone is analyzed by reproducing a test signal for a length of the selected coil, and the analysis is iteratively performed by increasing a length of a coil until an appropriate output is obtained. A current intensity may be determined according to a magnetostatic field strength in the same manner as described above. The current intensity is determined by iteratively measuring current intensity from the lowest level to an appropriate level until distortion does not occur or a sufficient output is produced.

An ANC system according to an exemplary embodiment will now be described in detail.

An ANC system operates before MRI begins by selecting a coil or transducer suitable for a position of a non-magnet dynamic speaker. In a multi-coil type non-magnet dynamic speaker, coils are operated in order from shortest to longest. The shortest coil is operated using a test signal such as random noise or a sweep sine signal. After outputting a test signal with the largest output, an input signal fed via a microphone is analyzed.

If the analysis result shows that distortion occurs or an output of the speaker is insufficient, the next shortest coil is sequentially operated. In sequentially operated coils as well, characteristics of the speaker are tested in order of a coil length by analyzing whether distortion occurs or an amplitude of an output for a test signal with the largest output. If a testing result shows that distortion does not occur in a coil and an output Levelspeaker of the speaker is sufficient compared to the amplitude LevelMRI_noise of the MRI noise as shown in Equation (4) below, use of a coil currently being tested is determined, and the process proceeds to a subsequent operation.

$$\text{Level}_{speaker} > \text{Level}_{MRI\_noise} \quad (4)$$

In a non-magnet dynamic speaker (hereinafter, referred to as a 'speaker') equipped with multi-transducers, an output signal of the speaker that is fed via a microphone is analyzed by inputting a test signal to a coil. The output signal varies according to a position of the speaker and an angle of the speaker with respect to a magnetostatic field BO. If distortion occurs or a level of an output as compared to a level of MRI noise is insufficient as a result of analysis, a piezoelectric device may be selected. If distortion does not occur, or level of an output as compared to a level of MRI noise is sufficiently high when a coil operates, the coil is selected, and the process proceeds to a subsequent operation.

When a coil or transducer is selected, a gain for the coil or transducer is calculated and reflected. The gain is determined by comparing an MRI noise level with a level of an output of the speaker determined according to a position of the speaker and an angle of the speaker with respect to a magnetostatic field BO. Alternatively, the gain is determined by comparing an MRI noise level with a level of an output of a piezoelectric speaker. In this case, previously measured statistical information is used as information about an MRI noise level, and data input via a microphone during analysis of a test signal for selecting a coil or transducer is used as a level of an output of the speaker. In this way, a gain is calculated as a value between 0 and 1 based on information about a ratio of sound pressure of a microphone.

Figure 19:
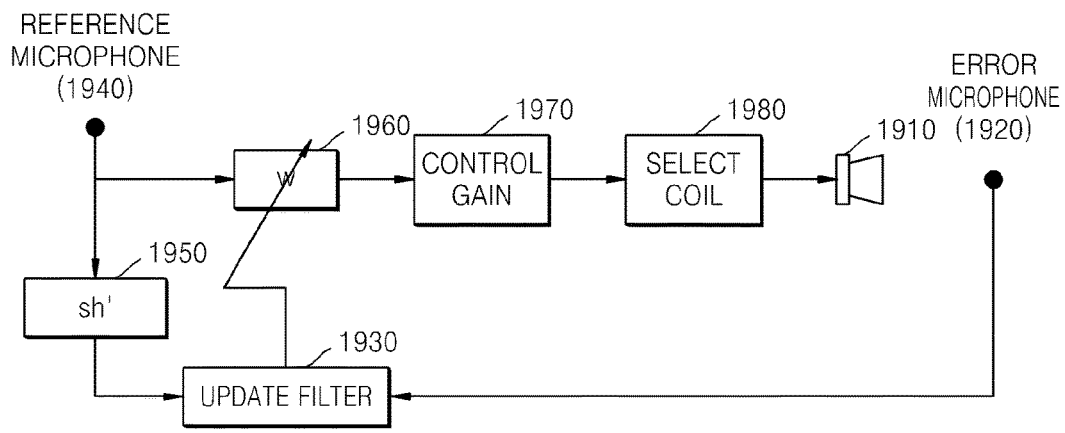
FIG. 19 illustrates an active noise reduction algorithm according to an exemplary embodiment.

FIG. 19 illustrates an active noise reduction algorithm according to an exemplary embodiment.

Referring to FIG. 19, when a coil or transducer is determined and then a gain is calculated, an MRI procedure begins, and coefficients of an ANC filter W is calculated for noise generated by the MRI procedure.

An output is produced by a non-magnet dynamic speaker (hereinafter, referred to as a 'speaker') (operation 1910).

Output characteristic information of the speaker and input information of an error microphone located near a human ear is acquired (operation 1920).

The ANC filter W is updated to reduce MRI noise input via the error microphone, by using the input information of the error microphone and the output characteristic information of the speaker (operation 1930).

Information of an input signal fed via a reference microphone for analyzing characteristics of an MRI noise is acquired (operation 1940).

An input from the reference microphone is corrected using a transfer function between the speaker and the error microphone (operation 1950). sh' denotes a block for the correction of the input.

The ANC filter W calculated and updated in operation 1930 is convoluted with an input signal of the reference or error microphone to thereby produce a final MRI noise control signal (operation 1960).

A gain is reflected in the MRI noise control signal (operation 1970).

A coil selector or transducer selector transmits a control signal to an input line of the previously selected coil or transducer (operation 1980).

The control signal is output via the speaker (operation 1910). The control signal output via the speaker interferes destructively with the MRI noise near an ear to reduce amplitude of MRI noise reaching the ear. The reduced amplitude of MRI noise is analyzed again via the error microphone for reuse in updating the ANC filter W in operation 1930. Through an iterative process, ANC is performed on an MRI noise.

An exemplary embodiment includes a system and method of enabling communication between a talker and the other party during operation of a device that generates periodic noise by facilitating smooth communication between the two parties. Furthermore, one or more exemplary embodiments include a system and method of enabling communication between a patient and medical staff during an MRI procedure, which allow the medical staff to monitor the patient's condition. The system and method are designed to cancel out a noise signal and transmit an audio signal in an environment with high levels of noise, thereby reducing fatigue or stresses of the two parties (e.g., a patient and a doctor) during bidirectional communication. A noise cancellation method used in one or more exemplary embodiments uses a technique for removing only a spectrum of a noise signal from an input signal in the frequency domain using a pattern of the noise signal in a noise cancellation operation. The noise cancellation method suppresses amplification of noise and exhibits stable performance even when a noise signal does not precisely match a noise pattern. By updating a noise pattern through further removal of residual noise and monitoring, the noise cancellation method may adapt to a quickly changing noise pattern.

Furthermore, one or more exemplary embodiments relate to a method of effectively performing ANC on a low-frequency noise in an MRI environment using a non-magnet dynamic speaker. Unlike a method using a non-magnet dynamic speaker that does operate normally in a space outside a bore with a low magnetostatic field strength, noise may be reduced via ANC anywhere by using a non-magnet dynamic speaker that operates regardless of a magnetostatic field strength. To achieve this, a structure for controlling the total amount of current flowing across a voice coil and a method of adjusting a length of a voice coil and current intensity. By combining the method with a noise control algorithm, an ANC system using a non-magnet dynamic speaker that is operable both inside and outside an MRI bore is provided. The ANC system may reduce MRI noise without regard to a change in magnetostatic field strength according to a position outside or inside an MRI bore as well as a change in output of a speaker due to an angle of a position of the speaker with respect to a magnetostatic field.

Figure 20:
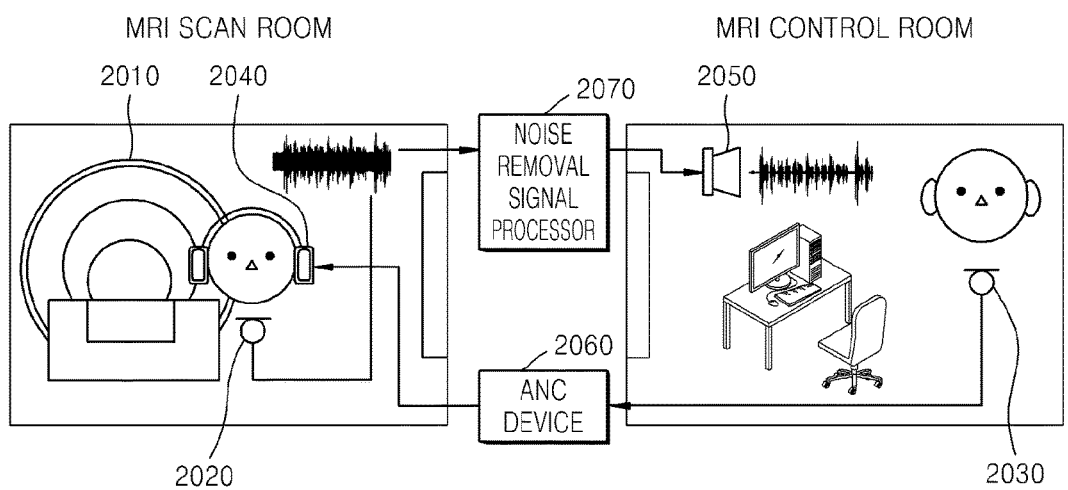
FIG. 20 illustrates a magnetic resonance imaging (MRI) system according to an exemplary embodiment.

FIG. 20 illustrates an MRI system according to an exemplary embodiment. Referring to FIG. 20, the MRI system includes a bore 2010, a first audio input device 2020, a second audio input device 2030, a first output device 2040, a second output device 2050, an ANC device 2060, and a noise reduction signal processor 2070.

The bore 2010 generates a magnetic field. The magnetic field is generated by a magnet or electromagnet, and may create electromagnetic waves to obtain information about the inside of a human body. The first audio input device 2020 receives an audio signal containing speech of a first user located near the bore 2010, e.g., a patient in an MRI scan room. The first audio input device 2020 may acquire speech having a high SNR even in an environment with high levels of noise by using a directional microphone.

The second audio input device 2030 receives an audio signal containing speech of a second user who controls MRI, e.g., medical staff in an MRI control room. The first audio input device 2020 may acquire speech having a high SNR even in an environment with high levels of noise by using a directional microphone The first output device 2040 outputs an audio signal containing speech of the second user (e.g., the medical staff) to the first user (e.g., the patient) via a non-magnet speaker.

The second output device 2050 outputs an audio signal containing speech of the first user (the patient) to the second user (the medical staff).

The ANC device 2060 performs ANC on the audio signal from the second audio input device 2030 according to a strength of a magnetostatic field used in MRI and transmits the result to the first output device 2040.

The noise reduction signal processor 2070 estimates a noise pattern from the audio signal from the first audio input device 2020, removes the noise pattern in the frequency domain, and transmits the result to the second output device 2050.

In one or more exemplary embodiments, as shown in FIG. 20, bidirectional communication is allowed in the MRI system. Speech of a patient placed within the bore 2010 is input with an MRI noise via the first audio input device 2020 and passes through the noise reduction signal processor 2070. An audio signal obtained by reducing the MRI noise is then delivered to the second user (the medical staff), and speech of the second user may also be output to the first user (the patient) via the first output device 2040, i.e., a headset incorporating an ANC function. In this case, the first audio input device 2020, i.e., a microphone for acquisition of speech, and the first output device 2040, i.e., the headset, used in the MRI scan room should be formed as devices that do not adversely affect an MRI procedure. The first output device 2040 may be replaced with a speaker mounted in the MRI scan room or console.

Figure 21:
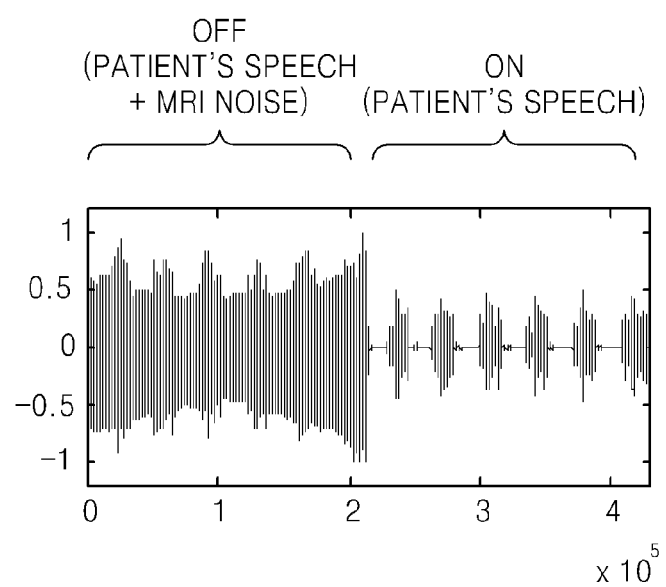
FIG. 21 illustrates a simulation result showing that noise is cancelled out by applying an algorithm to an MRI noise.

FIG. 21 illustrates a result showing that MRI noise is cancelled out and an audio signal is obtained by applying an algorithm in real MRI equipment Furthermore, in one or more exemplary embodiments, it is possible to provide entertainment services based on characteristics of a patient during an MRI procedure. A patient may select content in an interworking electronic device by using a display and an audio playing apparatus. For example, music or video that gives a patient emotional stability may be provided. In addition, it is possible to shorten the entire medical treatment time via additional diagnosis of a patient and a remote consultation with a doctor and provide medical information and advertisements customized for the patient during a long duration MRI scan.

During communication with someone outside in a helicopter or factory that generates high levels of periodic noise, noise reduction methods according to one or more exemplary embodiments may allow an audio signal to be transmitted to the other party while cancelling out noise Furthermore, when communication is performed in an environment having periodic noises from transport vehicles such as cars, motorcycles, and trains and home electronic appliances such as vacuum cleaners and washing machines, the noise reduction methods allow transmission of an audio signal by reducing noise.

Exemplary Embodiments may be embodied as a computer-readable code on a computer-readable storage medium. The computer-readable storage medium is any data storage device that can store data which can be thereafter read by a computer system.

Examples of computer-readable storage media include read-only memory (ROM), random-access memory (RAM), CD-ROMs, magnetic tapes, floppy disks, optical data storage devices, and carrier waves (e.g., transmission through the Internet). The computer-readable storage media can also be distributed over network coupled computer systems so that computer-readable codes are stored and executed in a distributed fashion. Furthermore, functional programs, codes, and code segments for accomplishing exemplary embodiments can be programmed by programmers skilled in the art.

While one or more exemplary embodiments have been described with reference to the figures, it will be understood by one of ordinary skill in the art that various changes in form and details may be made therein without departing from the spirit and scope of the inventive concept as defined by the following claims. Thus, it should be understood that the exemplary embodiments described therein should be considered in a descriptive sense only and not for purposes of limitation. The scope of the exemplary embodiments is defined not by the detailed description but by the appended claims, and all differences within the scope of the appended claims and their equivalents will be construed as being included in the exemplary embodiments.

What is claimed is:

1. An audio apparatus comprising:
an input interface configured to receive an audio signal containing noise;
a period estimator configured to estimate a period of a noise pattern in the audio signal;
a noise reducer configured to subtract and remove the noise pattern from the audio signal in a frequency domain by using the estimated period of the noise pattern;
a noise updater configured to update the noise pattern according to a change in amplitude of the noise; and
an output interface configured to output the audio signal obtained by removing the noise pattern by using a non-magnet speaker including a plurality of coils,
wherein the output interface is configured to determine a length of a coil by selecting at least one of the plurality of coils according to a change in output of the non-magnet speaker.

2. The audio apparatus of claim 1, wherein the period estimator is configured to acquire period information of the noise from a device that generates the noise, or calculate period information by using data in the audio signal acquired for a predetermined time.

3. The audio apparatus of claim 1, wherein the noise reducer comprises a matching device configured to match the noise pattern with a timing index of a current frame in the audio signal and a calculator configured to remove a spectrum of a noise frame that is matched with the timing index of the current frame and remove residual noise via post-processing.

4. The audio apparatus of claim 1, wherein the noise updater is configured to determine whether speech is present in a current frame in the audio signal, update the noise pattern and request the noise reducer to remove the noise pattern from the audio signal if the speech is not present in the current frame,
wherein the noise updater is further configured to determine whether an output signal obtained by removing the noise pattern is amplified to a greater extent than the noise and diverges, and if the output signal diverges, request the period estimator to initialize information of the noise pattern.

5. A method of reducing noise, the method comprising:
receiving an audio signal containing the noise;
estimating a period of a noise pattern in the audio signal;
subtracting and removing the noise pattern from the audio signal in a frequency domain by using the estimated period of the noise pattern;
updating the noise pattern according to a change in amplitude of the noise;
determining a length of a coil by selecting at least one of a plurality of coils according to a change in output of a non-magnet speaker including the plurality of coils; and
outputting the audio signal obtained by removing the noise pattern by using the non-magnet speaker.

6. The method of claim 5, wherein the estimating of the period of the noise pattern comprises acquiring period information of the noise from a device that generates the noise, or calculating period information by using data in the audio signal acquired for a predetermined time.

7. The method of claim 5, wherein the subtracting and removing of the noise pattern comprises:
matching the noise pattern with a timing index of a current frame in the audio signal;
removing a spectrum of a noise frame that is matched with the timing index of the current frame; and
removing residual noise via post-processing.

8. The method of claim 5, wherein the updating of the noise pattern comprises:
determining whether speech is present in a current frame in the audio signal;
updating the noise pattern and removing the noise pattern from the audio signal if the speech is not present in the current frame;
determining whether an output signal obtained by removing the noise pattern is amplified to a greater extent than the noise and diverges; and
initializing information of the noise pattern if the output signal diverges.

* * * * *